(12) United States Patent
Rodriguez Zermeno et al.

(10) Patent No.: US 10,153,071 B2
(45) Date of Patent: Dec. 11, 2018

(54) SUPERCONDUCTING DEVICES BY OPTIMIZATION OF THE SUPERCONDUCTOR'S LOCAL CRITICAL CURRENT

(71) Applicant: KARLSRUHER INSTITUT FUER TECHNOLOGIE, Karlsruhe (DE)

(72) Inventors: Victor Manuel Rodriguez Zermeno, Karlsruhe (DE); Bernhard Holzapfel, Kreischa (DE)

(73) Assignee: KARLSRUHER INSTITUT FUER TECHNOLOGIE (DE)

( * ) Notice: Subject to any disclaimer, the term of this patent is extended or adjusted under 35 U.S.C. 154(b) by 383 days.

(21) Appl. No.: 14/819,850

(22) Filed: Aug. 6, 2015

(65) Prior Publication Data

US 2016/0042841 A1     Feb. 11, 2016

(30) Foreign Application Priority Data

Aug. 6, 2014   (EP) ..................................... 14002754

(51) Int. Cl.
*H01B 12/02*     (2006.01)
*H01L 39/14*     (2006.01)
*H01F 6/06*      (2006.01)
*H01B 13/00*     (2006.01)

(52) U.S. Cl.
CPC ......... *H01B 12/02* (2013.01); *H01B 13/0036* (2013.01); *H01F 6/06* (2013.01); *H01L 39/14* (2013.01); *H01L 39/143* (2013.01)

(58) Field of Classification Search
None
See application file for complete search history.

(56) References Cited

U.S. PATENT DOCUMENTS 5,173,678 A * 12/1992 Bellows ................... H01F 6/06
                                                              29/606
5,310,705 A *  5/1994 Mitlitsky ................. H01F 6/06
                                                             335/216
(Continued)

FOREIGN PATENT DOCUMENTS

JP          5226707         9/1993
JP        2007172978        7/2007
(Continued)

OTHER PUBLICATIONS

Zhang, Min et al. "Study of second generation, high-temperature superconducting coils: Determination of critical current," Journal of Applied Physics, 2012, 111.
(Continued)

*Primary Examiner* — Colleen P Dunn
(74) *Attorney, Agent, or Firm* — Onello & Mello, LLP

(57) ABSTRACT

The present invention relates to a method and an apparatus for producing superconducting devices and to superconducting devices. The method comprises determining one or more regions of reduced critical current density in the superconducting device and modifying the critical current density in the one or more regions of reduced critical current density, so as to increase the overall critical current or to decrease the overall AC losses of the superconducting device. The modifying comprises modifying the amount and/or distribution of the superconducting material in the one or more regions of reduced critical current density; and/or modifying the chemical composition of the superconducting material in the one or more regions of reduced critical current density; and/or decreasing the cooling temperature in the one or more regions of reduced critical current density. A superconducting device formed according to such method can also be provided.

7 Claims, 16 Drawing Sheets

(56) References Cited

U.S. PATENT DOCUMENTS

| | | | | |
|---|---|---|---|---|
| 5,525,583 A | * | 6/1996 | Aized | H01F 6/02 |
| | | | | 29/599 |
| 5,914,647 A | * | 6/1999 | Aized | H01F 6/02 |
| | | | | 335/216 |
| 6,081,179 A | * | 6/2000 | Kato | H01F 6/04 |
| | | | | 335/216 |
| 2007/0111893 A1 | * | 5/2007 | Kodenkandath | H01L 39/143 |
| | | | | 505/210 |

FOREIGN PATENT DOCUMENTS

| | | |
|---|---|---|
| JP | 2009238888 | 10/2009 |
| JP | 201337838 | 2/2013 |
| WO | 9520228 | 7/1995 |
| WO | 2006021003 | 2/2006 |

OTHER PUBLICATIONS

Norris, W. T. "Calculation of hysteresis losses in hard superconductors carrying ac: isolated conductors and edges of thin sheets," Journal of Physics D: Applied Physics, 1970, 3, 489.

Amemiya, Naoyuki, et al. "AC Loss reduction of YBCO coated conductors by multifilamentary structure," Supercond. Sci. Technol. 17 (2004) 1464-1471. doi:10.1088/0953-2048/17/12/018.

Brandt, E. H. "Thin superconductors in a perpendicular magnetic AC field: General formulation and strip geometry," Phys. Rev. B 49-13 pp. 9024-9040, 1994 doi: 10.1103/PhysRevB.49.9024.

N.D. Khatri, et al. "Pre-fabricated nanorods in RE—Ba—Cu—O superconductors," SUST 26, 8 doi:10.1088/0953-2048/26/8/085022.

Zhang, Yifei, Ph.D. "Key Performance of 2G HTS Wire for Coil Applications," SuperPower, Furukawa Electric Group. May 29, 2013. Power Point Presentation.

European Search Report for related application No. 14002754.1 dated Apr. 24, 2015.

Lyly, Mika, et al. "Design Process for a NbTi Wire with New Specification Objectives: Technical Design Constraints and Optimization of a Wire Layout Considering Critical Current and AC Losses," IEEE Transactions on Applied Superconductivity, vol. 23, No. 1, Feb. 2013.

Ashworth, S. P., et al. "A Novel Cooling Scheme for Superconducting Power Cables," Cryogenics 51 (2011) 161-167.

List, F. A., et al. "Fabrication of Filamentary YBCO Coated Conductor by Inkjet Printing," IEEE Transactions on Applied Superconductivity, vol. 17, No. 2, Jun. 2007.

* cited by examiner

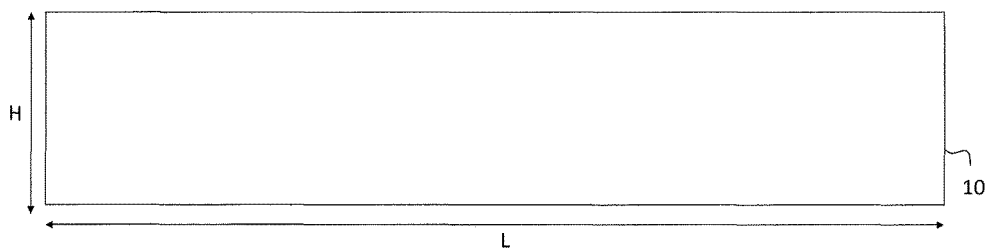
Fig. 1
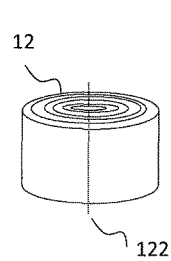 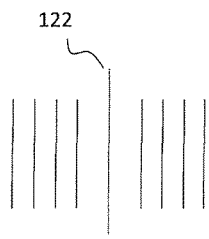 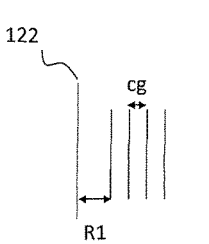 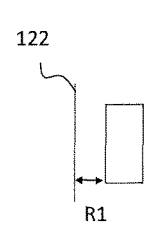
Fig. 2A   Fig. 2B   Fig. 2C   Fig. 2D
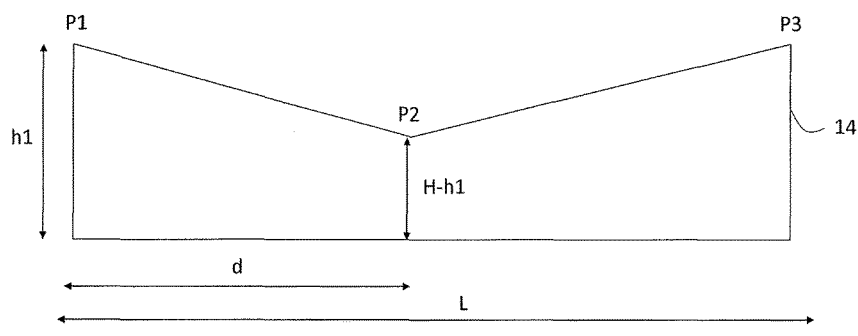
Fig. 3
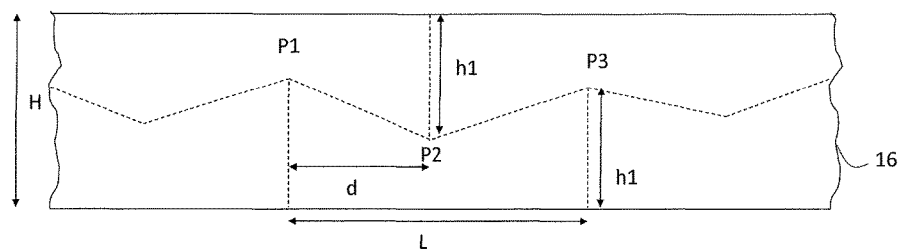
Fig. 4

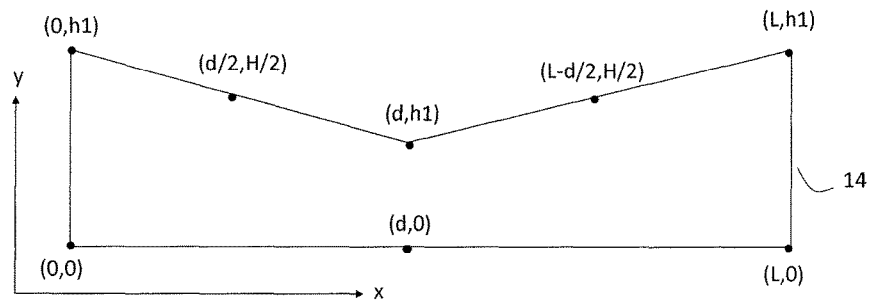
Fig. 5A
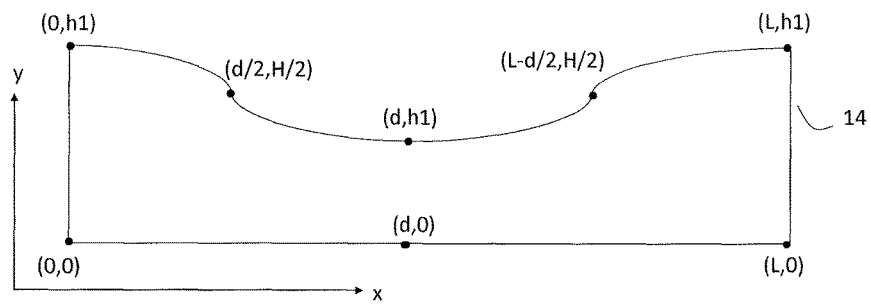
Fig. 5B
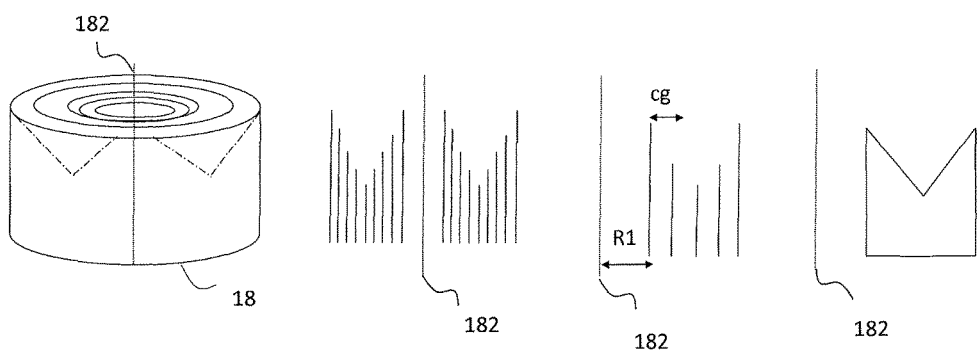
Fig. 6A     Fig. 6B     Fig. 6C     Fig. 6D

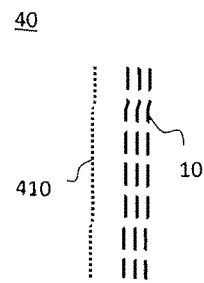
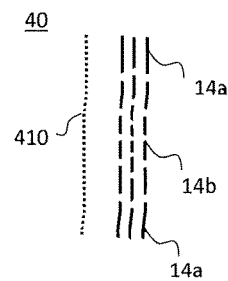
Fig. 10A            Fig. 10B
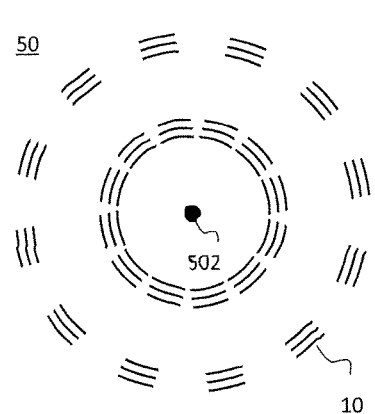
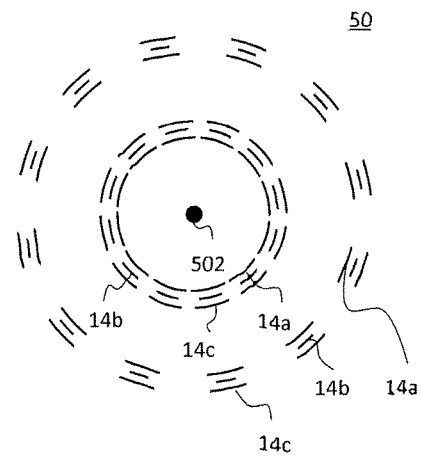
Fig. 11A            Fig. 11B
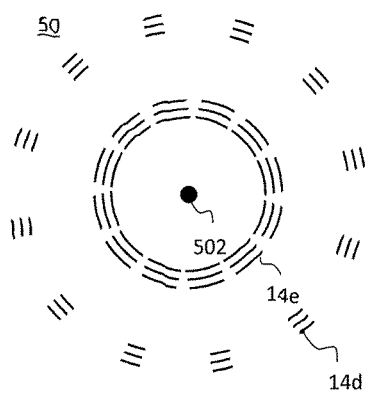
Fig. 11C

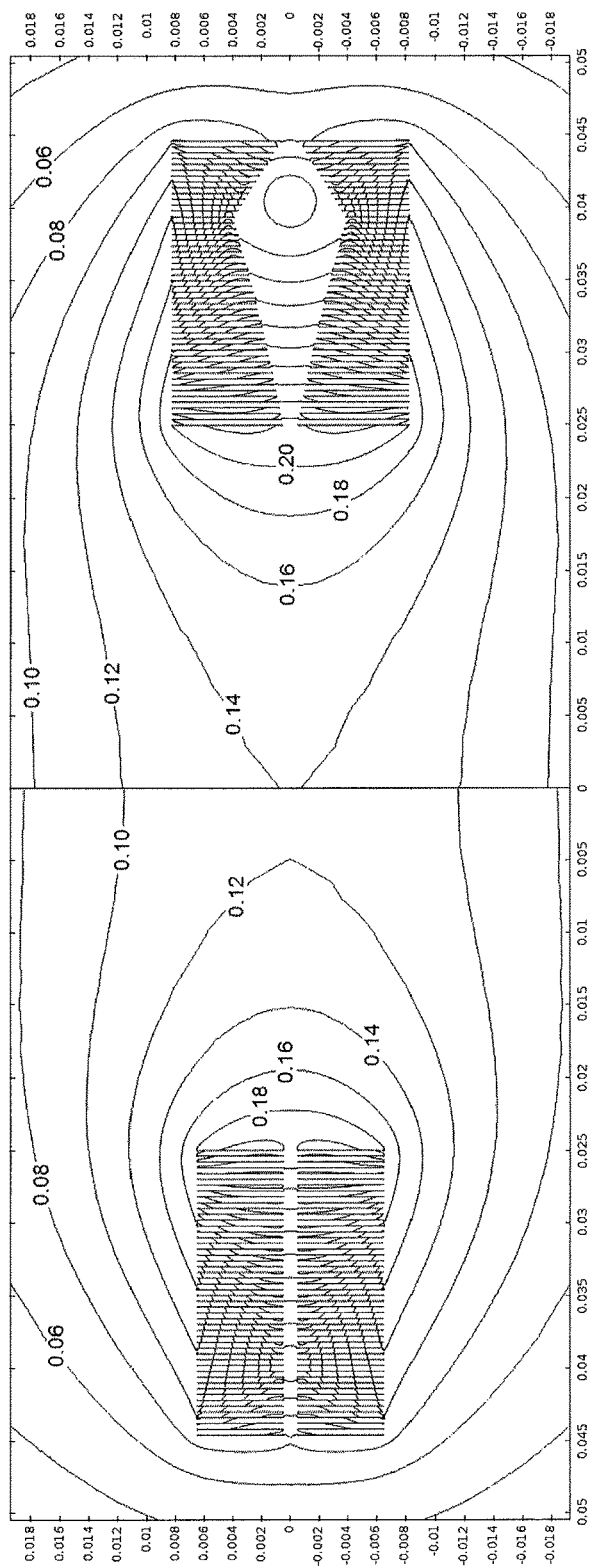
Fig. 19A  I = 65.11 A
Fig. 19B  I = 79.24 A

SUPERCONDUCTING DEVICES BY OPTIMIZATION OF THE SUPERCONDUCTOR'S LOCAL CRITICAL CURRENT

CROSS REFERENCE TO RELATED APPLICATION

The present application claims priority under 35 USC § 119 to European Patent Application 14 002 754.1, filed Aug. 6, 2014, entitled DESIGN OF SUPERCONDUCTING DEVICES BY OPTIMIZATION OF THE SUPERCONDUCTOR'S LOCAL CRITICAL CURRENT, the contents of which are incorporated herein by reference in their entirety.

FIELD OF INVENTION

The present invention relates to a method and an apparatus for producing superconducting devices as well as to superconducting devices.

BACKGROUND

Superconducting materials and devices produced from superconducting materials are known in the art. A characteristic property of a superconductor is its superconductivity, i.e. the disappearance of its electrical resistance when it is cooled below a critical temperature. However, upon the application of a magnetic field equal to or greater than a critical field (Hc2), the superconductivity is lost. Associated with the critical magnetic field is a critical current, i.e. the current at which the superconducting material loses its superconducting properties and reverts back to its normal, i.e. non-superconducting, state. For applied magnetic fields with amplitudes below the critical field, the superconducting state is not lost, but the value of the critical current is reduced. Therefore, the critical current of a superconducting conductor is dependent upon the amplitude and direction of the externally applied field.

In traditional coil, solenoid or toroid designs, one turn—typically the innermost in coils or toroids and the outermost in solenoids—is exposed to a higher magnetic field than the other turns, hence decreasing its critical current and therefore the overall critical current of the superconducting device. Conventional designs do not address this problem. Rather, the limitation of the overall critical current, for example by the current in the innermost turn of a coil, is merely seen as a characteristic of the superconducting device.

SUMMARY OF INVENTION

In view of the above, an object of the present invention is to provide superconducting devices with increased overall critical current and/or reduced overall AC losses and methods and apparatuses for their production.

The above object is solved by a method for providing a superconducting device of claim 1, a superconducting device of claim 7, an apparatus for producing a superconducting device of claim 15 and a computer program product of claim 16. Preferred embodiments are defined in the dependent claims.

According to an aspect, there is provided a method for providing or optimizing a superconducting device comprising:

determining one or more regions of reduced critical current density in the superconducting device;

modifying the critical current density in the one or more regions of reduced critical current density, so as to increase the overall critical current or to decrease the overall AC losses of the superconducting device, said modifying comprising:

modifying the amount and/or distribution of the superconducting material in the one or more regions of reduced critical current density; and/or modifying the composition or type of the superconducting material in the one or more regions of reduced critical current density; and/or decreasing the cooling temperature in the one or more regions of reduced critical current density.

As a result of the modifying step, a new spatially varying distribution of the amount of superconducting material and/or the composition of superconducting material and/or the cooling temperature in the superconducting device is obtained. The superconducting device with the newly determined spatially varying distribution may be manufactured by any known manufacturing method.

As described above, in conventional superconducting devices the overall critical current of the device is decreased, for example due to the increase of the magnetic field in certain regions of the superconducting device (such as for example the innermost turn in coils). However, the limitation of the overall critical current is merely seen as a characteristic of the superconducting device.

The present invention, on the other hand, proposes to use the dependency of the critical current density on the field and/or material composition and/or temperature to produce devices with higher overall (net) critical current and/or lower overall (net) AC losses, or devices capable of producing magnetic fields of larger amplitudes.

In particular, two main cases may be considered:
1. Transport current: This case applies to devices for which a net electric current (transport current) is applied to the device, such as for example coils, solenoids, toroids, etc.; and
2. Magnetization: This case applies to devices intended for magnetization purposes, such as for example striated conductors, stacks of them, etc.

In the first case, the main principle behind the invention is the compensation of the critical current ($I_c$) reduction, due for example to the magnetic field, by locally enhancing the critical current density of the superconductor. The resulting overall increase of the device's critical current $I_c$ yields a reduction of the hysteretic (or AC) losses of the device.

In the second case, the overall AC magnetization losses may be reduced by modifying the critical current density distribution across the device. The critical current density distribution may be modified such that the AC magnetization losses in some parts of the device are reduced, possibly at the price of increasing the AC magnetization losses in other parts of the device. For example, the width of the filament(s) of a striated conductor may be decreased in the central region of the conductor at the price of increasing the width of the filament(s) at the ends of the conductor. It has been found out, that due to the non-linear behavior of the superconducting material, the reduction of the losses may be larger than its increase, leading to an overall reduction of the AC magnetization losses.

In the following, the above mentioned cases will be explained in more detail:

The determination of the critical current in superconducting coils is addressed for example by Zhang et al. in the paper "Study of second generation, high-temperature superconducting coils: Determination of critical current", published in Journal of Applied Physics, 2012, 111. According to Norris W. T. "Calculation of hysteresis losses in hard superconductors carrying ac: isolated conductors and edges of thin sheets", published in Journal of Physics D: Applied Physics, 1970, 3, 489, the AC loss in a superconducting thin strip is proportional to where $$L_2 = \frac{(1-f)\log[1-f] + (1+f)\log[1+f] - f^2}{\pi}$$

and where $f=I/I_c$ is the ratio of the applied current I with respect to the critical current $I_c$. FIG. 23 shows the dependency of $L_2$ on $(I/I_c)$. For a large range of values of interest, $L_2$ is at least proportional to $(I/I_c)^4$.

Thus, for a large range of values of interest, the losses are at least proportional to $I_c^2(I/I_c)^4$ or equivalently to $I^4/I_c^2$. This means that for a fixed applied current, the losses are at least proportional to $1/I_c^2$. Therefore, lower critical currents imply higher AC losses.

According to aspects of the invention, it is proposed to at least partially compensate for the reduction of the critical current ($I_c$) due to the magnetic field by locally enhancing the critical current density of the superconducting device.

The enhancement of the net critical current can be achieved by various techniques. Among these techniques are locally varying the amount and/or distribution of the superconducting material and/or locally varying the composition/type of the superconducting material and/or locally varying the cooling temperature in the regions of reduced critical current density and thus reduced net critical current. The techniques may include for example:

Use of conductors of varying or several cross-section(s) (e.g. use of conductors of varying or several width(s), thickness(es), radius/radii, etc.);

Use of conductors of varying or several critical currents $I_c$ (e.g. use of conductors with varying or several doping concentrations or different doping types);

Use of temperature variations (e.g. use of device design such that the coldest part of the cryostat is applied to the regions with lower critical current density $J_c$, hence enhancing the overall critical current $I_c$ of the device).

The above applies to other superconducting devices such as solenoids, toroids, cables, etc.

For devices intended for magnetization purposes (such as superconducting tapes), AC losses due to magnetization can be reduced by striating the tapes to create filaments, as known in the art (see for example Amemiya, Naoyuki et al. "AC loss reduction of YBCO coated conductors by multi-filamentary structure" Supercond. Sci. Technol. 17 (2004), pp: 1464-1471). The gaps between the filaments allow the magnetic field to pass between them, thereby reducing the overall losses. Just like the current transport problem is described by Norris's expression, the magnetization case is described by Brandt's formula (see equation 6.10 in the paper Brandt, E. H. "Thin superconductors in a perpendicular magnetic ac field: General formulation and strip geometry" Phys. Rev. B 49-13 pp: 9024-9040, 1994). Although this analytic expression assumes a superconducting material with constant critical current density $J_c$, it is possible to use it to infer useful information in the general case. For a superconducting strip of width a, thickness d and critical current density $J_c$ the time-averaged dissipation per unit length ($P_{NL\perp}$) in a perpendicular AC field of amplitude $H_m$ and frequency ν is given by:

$$P_{NL\perp} = 4\pi a^2 \nu \mu_0 H_{c\perp} H_m g(H_m/H_{c\perp}),$$

where $H_{c\perp}=J_c d/\pi$ is the field of full penetration and $g(x)=(2/x)\ln(\cos h(x))-\tan h(x)$.

Since $g(x) \approx x^3/6$ for $x \ll 1$, the loss can be approximated by:

$$P_{NLL} \approx \frac{2\pi\mu_0\nu}{3}\left(\frac{a^2 H_m^4}{H_{c\perp}^2}\right) = \frac{2\pi^3\mu_0\nu}{3d^2}\left(\frac{a^2 H_m^4}{J_c^2}\right)$$

for fields of small amplitude ($H_m \ll H_{c\perp}$).

Therefore in a large range of interest, the losses increase monotonically with the increase of either the width of the strip or the amplitude of the applied magnetic field and decrease monotonically with the increase of the critical current density. FIG. 24 shows the magnetization AC losses as given by Brandt's formula for superconducting strips with thickness of 1 μm considering different values for the amplitude of the applied magnetic flux density ($B_m$). To ease the interpretation, the loss value is scaled by $a^{-2}\nu^{-1}$. The horizontal axis is the critical current density ($J_c$) in [GA/m²].

Although Brandt's formula applies to individual strips, it is possible to use it to infer useful information for the case of striated tapes.

As the flux lines pass through the gaps between the filaments, the flux lines get closer. This has the effect of locally increasing the magnetic flux density in the region in and around the gaps. Since the filaments in the center of the tape are surrounded by other neighboring filaments, the filaments' edges experience a higher flux density than if they were isolated with no neighboring filaments. This reduces the critical current density $J_c$ in this region of the filament. Meanwhile, the filaments on the edges of the tape, having no neighbors on one side, experience a magnetic flux density that is lower than in the center of the tape. This also reduces the critical current density $J_c$ in the outer filament, although to a lower degree than if the filament were in the central region of the tape. Overall, the filaments at the edge of the tape will experience a magnetic flux density of smaller amplitude and a related lower reduction of its local critical current density $J_c$ when compared to their counterparts in the inner region of the tape.

For fields of small amplitude, the filaments in the innermost regions are responsible for a larger share of the AC losses. Considering Brandt's formula, it follows that the losses can be reduced by decreasing the width of the filaments as the losses have a quadratic dependence with respect to the width of the strip. However, there are limitations that prevent one from making arbitrarily narrow filaments. The filaments are created by removing part of the superconducting material and a balance is sought between the AC losses and the amount of material lost.

This issue can be overcome by balancing the non-uniform reduction of $J_c$ caused by the magnetic field in the filaments throughout the different areas of the striated tape. This can be achieved by various techniques. For example, filaments of different and/or varying widths may be used. In an example, the filaments at the edges of the tape (i.e. the outermost filaments) may be made wider. For a fixed number of filaments per tape, this allows creating narrower filaments in the central region of the tape that have lower losses due to their smaller width. Thus, it is possible to obtain a net reduction of the total AC losses in a striated tape when compared to a striated tape having filaments of equal width. The same principle applies to other striated superconducting devices.

Further, as in the case of devices to which a current is applied, varying chemical doping can be used to optimize superconducting devices intended for magnetization purposes. For instance, doped superconducting materials optimized for the particular angle of the applied field may be used in various regions of the device. Still further, temperature variations may be employed to achieve a net reduction of the total AC losses.

Accordingly, the distribution of the amount of superconducting material and/or the composition of superconducting material and/or the cooling temperature in the superconducting device according to an aspect of the invention is not uniform, but exhibits one or more local regions, in which the amount of superconducting material is increased or decreased with respect to the other regions and/or in which the composition or type of the superconducting material is different than in the other regions and/or in which the cooling temperature is decreased with respect to the other regions. The overall increase of the device's critical current $I_c$ yields a reduction of the hysteretic (or AC) losses of the device. Similarly, the balancing of the different critical current densities across the device leads to reduced AC losses in devices used for magnetization purposes.

The method for providing a superconducting device may comprise specifying or selecting an initial, non-optimized (non-modified) superconducting device, which may be any conventional superconducting device. The specifying of the initial, non-optimized superconducting device may include specifying parameters of the superconducting device, such as the form and dimensions of the superconducting device (width, diameter, length, cross-section), type and dimensions of the superconducting cables (e.g. tapes or wires) constituting the superconducting device, number of turns/windings, etc. The initial superconducting device may exhibit an initial spatial distribution of the amount and/or composition of a preselected superconducting material across the superconducting device, which may be a substantially uniform distribution. Further, the superconducting device may exhibit an initial spatial distribution of the cooling temperature, which may be a substantially uniform distribution.

The superconducting material may be any type of superconducting material, including any type of low or high temperature superconducting material. Examples of high temperature superconductor (HTS) materials are superconductors made from ceramic or metallic oxides, such as Cu—O-based ceramic superconductors, rare-earth-copper-oxide based superconductors, thallium-barium-calcium-copper-oxide superconductors, mercury-barium-calcium-copper-oxide based superconductors, bismuth-strontium-calcium-copper-oxide based superconductors, MgB2, Nb3Sn, NbTi among many others. The above compounds may be doped with different dopants, such as for example Zr, Gd3TaO7 and Ba2YnbO6, C, Ni or any other suitable dopant.

In a next step, the spatial distribution of the critical current density across the superconducting device, due for example to the magnetic field (including any self-induced magnetic field and if applicable any external magnetic field) may be determined, for example by using known models and/or simulation methods and tools, such as the methods disclosed in the above mentioned publications Zhang et al. "Study of second generation, high-temperature superconducting coils: Determination of critical current", published in Journal of Applied Physics, 2012, 111, Norris W. T. "Calculation of hysteresis losses in hard superconductors carrying ac: isolated conductors and edges of thin sheets", published in Journal of Physics D: Applied Physics, 1970, 3, 489 or Brandt, E. H. "Thin superconductors in a perpendicular magnetic ac field: General formulation and strip geometry" Phys. Rev. B 49-13 pp: 9024-9040, 1994. Alternatively or in addition, the regions of reduced critical current density may also be determined based on actual measurements of the initial, non-modified superconducting device or based on measurements of one or more reference superconducting devices. Based on the determined spatial distribution, one or more regions of reduced critical current density may be identified. The regions of reduced critical current density may be for example those regions which exhibit local minima of the critical current density or those regions that exhibit a critical current density that is lower than a given (device specific) value. The position and number of the local regions of reduced critical current density may vary depending on the superconducting device and its application. In an example, the regions of reduced critical current density may be due to the amplitude and/or orientation of the magnetic field with respect to the superconducting material.

For example, if the superconducting device is a superconducting coil having a plurality of turns (windings) of a superconducting cable (such as for example a superconducting tape or wire), the highest magnetic field may be typically exhibited in the innermost turn of the coil. Accordingly, the region(s) of reduced critical current density may correspond to or comprise the innermost turn(s) of the coil.

In single layer solenoids, the limiting turns are typically located at the ends or end areas of the solenoid when viewed in a direction of the solenoid's axis. For example, if the solenoid's axis is vertical, the end areas correspond to the top and the bottom of the solenoid. Thus the region(s) of reduced critical current density of a single layer solenoid may correspond to or comprise the turn(s) located at the ends of the solenoid.

In single layer toroids, the limiting current is typically determined by the region of each turn that is located closest to the centroid of the toroid. Accordingly, the region(s) of reduced critical current density of a single layer toroid may correspond to or comprise the regions located closest to the centroid of the toroid in each turn of the toroid.

In multilayer solenoids, there may be further local variations of the critical current in addition to the above mentioned variations of the critical current associated with the single layer case. In general, the turns closest to the solenoid axis will have reduced local critical current due to locally enhanced magnetic field. Thus, in multilayer solenoids the region(s) of reduced critical current density may comprise the turns located at the ends of the solenoid and/or the turns closest to the solenoid axis.

Similarly, in multilayer toroids there may be further local variations of the critical current in addition to the above-mentioned variations of the critical current associated with the single layer case. In general the inner toroid layers will exhibit reduced critical current due to locally enhanced magnetic field. Thus, in multilayer toroids the region(s) of reduced critical current density may comprise the regions located closest to the centroid of the toroid in each turn of the toroid and/or the inner toroid layers.

In striated superconducting tapes, the region(s) of reduced critical current density may correspond to or comprise the central filament(s) of the striated tape, i.e. the filament(s) in the central (inner) area of the tape. Depending on the specific application of the tape, the regions of reduced critical current density may comprise other areas of the tape.

In stacked superconducting devices (such as for example stacked magnets) comprising a plurality of superconducting layers, each superconducting layer having a plurality of filaments, the region(s) of reduced critical current density may correspond to or comprise the inner regions or inner filament(s) of each superconducting layer of the stacked superconducting device. Depending on the specific application of the tape or the stacked magnet, the regions of reduced critical current density may comprise other areas of the tape or stacked magnet.

In a next step, the amount, distribution, composition and/or temperature of the superconducting material may be locally varied/modified, for example by locally varying/modifying the cross-section of at least one superconductor (for example a superconducting cable, layer or filament) constituting the superconducting device; and/or locally varying/modifying the material composition of the superconducting material of at least one superconductor (e.g. cable, layer or filament) constituting the superconducting device; and/or locally varying the cooling temperature of the superconducting device.

Subsequently, the net (overall) critical current or the overall AC losses of the superconducting device may be evaluated to determine whether a satisfactory level of the overall critical current or the overall AC losses of the superconducting device is achieved. If necessary, the steps of determining one or more regions of reduced critical current density and modifying the critical current density in the one or more regions of reduced critical current density may be repeated.

In an example, the step of locally modifying the critical current density includes modifying the amount and/or distribution of the superconducting material across the superconducting device.

The step of modifying the amount and/or distribution of superconducting material, for example in devices to which an electrical current is applied, may comprise increasing the amount of superconducting material in the one or more regions of reduced critical current density, for example by increasing the cross-sectional area of at least one superconductor (e.g. cable or layer) constituting the superconducting device. Optionally, the step of modifying the amount and/or distribution of superconducting material may further comprise locally decreasing the amount of the superconducting material in one or more regions of the superconducting device other than the one or more regions of reduced critical current density. Thus, the local increase of the amount of superconducting material in the regions of reduced critical current density can be at least partially compensated, while for example maintaining or increasing the overall critical current of the superconducting device and thus reducing the associated losses.

In devices intended for magnetization purposes, such as striated tapes or stacked tape magnets comprising a plurality of filaments, the step of modifying the amount and/or distribution of superconducting material may include decreasing the cross-sectional area of at least one filament in the one or more regions of reduced critical current density. The step of modifying the amount and/or distribution of superconducting material may further include increasing the width of the filament(s) in one or more regions of the superconducting device other than the one or more regions of reduced critical current density. For example the width of the filaments at the edges of a striated tape (i.e. the outermost filament(s)) may be increased while decreasing the width of at least one filament in a central area of the striated tape. By optimizing the width of the outermost filament or filaments, a net reduction of the total AC losses may be achieved as compared to the case of striated tape having filaments of equal width.

The widths of the individual filaments and/or their laws of variation will generally depend on the specific application of the superconducting device, in particular on the amplitude and/or orientation of the applied magnetic field.

The cross-section of the at least one superconductor (e.g. cable, layer or filament) constituting the superconducting device may be varied by varying the width, the thickness, the diameter and/or other geometrical parameters of at least one superconductor (e.g. a cable, layer or filament) constituting the superconducting device.

In an example, the superconducting device may consist of or may comprise a single superconducting cable (for example a single tape or wire). The cross-sectional area of the superconducting cable may be varied across the superconducting device, for example by varying the width and/or the thickness and/or the diameter of the superconducting cable along the length of the superconducting cable (i.e. in a lengthwise or longitudinal direction). Similarly, if the superconducting device comprises a superconducting layer, the width and/or the thickness of the superconducting layer may be spatially varied.

The superconducting device may comprise a plurality of individual superconducting cables (e.g. tapes or wires) or layers. In this case, a plurality (i.e. at least two) of individual superconducting cables or layers with different cross-sectional areas may be used (respectively distributed or arranged) in the different regions of the superconducting device. For example, superconducting cables or layers having larger cross-sectional areas may be used (distributed or arranged) in the one or more regions of reduced critical current density. The modifying the amount and/or distribution of superconducting material in the one or more regions of reduced critical current density may thus comprise modifying the width and/or the thickness and/or the diameter of at least one superconducting cable or layer of the plurality of the superconducting cables or layers that is/are arranged (used) in the at least one region of reduced critical current density. The cross-sectional area of each of the individual superconducting cables or layers may thereby remain substantially constant along the lengthwise direction of the superconductor or may be varied as described above.

In some examples the superconducting device may comprise a plurality of turns of a superconducting cable (for example a wire, a tape, etc.). The use of superconducting cables of varying or different cross-sectional area(s) across the superconducting device allows balancing the different critical current densities in each turn, hence providing a more uniform use of the superconducting material. The inverse quadratic relation between power loss and critical current means that by balancing the critical current of the turns and achieving a net increase of the critical current of the superconducting device (e.g. a coil), the overall AC losses are effectively reduced.

In an example, the superconducting device (e.g. a coil, a solenoid, a toroid, etc.) may comprise a plurality of turns (windings) of at least one superconducting cable (e.g. tape or wire) having a constant or a variable width. A different number of windings or different winding density of the at least one superconducting cable may be used in the different regions of the superconducting device, with the number or the density of the superconductor windings in the regions of reduced critical current density being decreased with respect to the number or density of the windings in the other regions of the superconducting device. For example, the winding density may be increased by using a thin wire for the regions that are not largely affected by the magnetic field and may be decreased by using a wider wire for the regions of reduced critical current density, thereby keeping both volume and weight substantially constant. Thus, the amount of superconducting material (AoSM) per Ampere of current transported may be decreased.

Alternatively or in addition to varying the amount of the superconducting material across the superconducting device, the step of modifying the critical current density in the one or more regions of decreased critical current density may comprise a step of locally varying the material composition of the superconducting material of at least one superconductor constituting the superconducting device, for example by varying the chemical doping concentrations and/or doping types of at least one superconductor constituting the superconducting device. If for example the superconducting device is assembled from a single superconductor, the chemical composition of the superconducting material may be varied across the superconductor. If the superconducting device is assembled from a plurality of superconductors (e.g. at least two different superconducting cables or superconducting layers), at least two different superconductors having different doping concentrations or types may be used in the different regions of the superconducting device.

Still further, the step of modifying the critical current density in the one or more regions of decreased critical current density may comprise varying or modifying the temperature across the superconducting device, for example by reducing the temperature in the one or more regions of reduced critical current density. This may be realized by configuring a cryocooler in such a way that the coldest point of the superconducting device is set to be at the location with the largest reduction of the critical current density (for example due to the magnetic field). The step of locally reducing the cooling temperature may for example comprise disposing or arranging heat sinks in or nearby the regions of reduced critical current density.

A combination of more than one of the above approaches is also possible.

According to another aspect, there is provided a superconducting device (for example a superconducting device provided by a method according to an aspect of the invention) having one or more local regions in which different amount of the superconducting material is used as compared to the other regions of the superconducting device; and/or the width of the filaments constituting the superconducting device is different than in the other regions of the superconducting device; and/or the type or composition of the superconducting material is different from the type or composition in the other regions of the superconducting device; and/or the cooling temperature is decreased as compared to the other regions of the superconducting device.

The superconducting device can be any type of superconducting device consisting of or using various superconductors, such as in the form of a cable (e.g. a superconducting tape, wire, striated mono or multifilament tape, etc.), a superconducting layer, a filament, etc. The superconducting device may consist of a single superconductor, such as a single superconducting tape, wire, striated tape, layer, etc.

The superconducting device may also comprise a plurality of superconductors, for example one or more superconducting tapes or wires, (stacked) superconducting layers, striated superconducting tapes, etc.

For example, the superconducting device may be a device assembled from one or more superconducting cables, which may be wound in various forms. Examples of such devices are coils of various forms, solenoids, toroids, etc. and devices comprising superconducting coils, solenoids, toroids, etc. The superconducting device may also be a device comprising one or more (stacked) superconducting layers, such as for example a stack-magnet or a device comprising stack-magnets. The superconducting device may be configured to generate a magnetic field for various applications, for DC or AC current transport, for magnetization purposes or for application in non-inductive coils, magnetic shielding devices, current limiters, etc.

Examples of coil-based superconducting devices include but are not limited to magnets, dipoles, quadrupoles, superconducting magnetic energy storage systems, current limiters, magnetic resonance devices (NMR, MRI, EPR, EMR, ESR and ICR), racetrack coils, coils for generators and motors, coils for transformers, saddle-shape coils, coils for accelerators, levitation and propulsion coils for magnetically levitated vehicles, magnetic separation devices, coils for split magnets, magnet coils for magnetization of permanent magnets and superconductors, magnet coils for characterization of samples, magnet coils for plasma confinement, coils for cyclotron, coils or coils-solenoid arrays for vector magnets, coils for magneto-optical systems, magnet coils for plasma diversion as in spacecraft communication systems, coils for magnetic propulsion of satellites (control of Hall effect thrusters). Similar applications exist for solenoids, toroids, magnets, cables and stack-like based superconducting devices.

The superconducting device is, however, not limited to the above examples but may be any type of superconducting device for which the overall critical current (AC or DC) is to be enhanced and/or the overall AC magnetization losses reduced.

The location and the number of the local regions in which the amount and/or the composition of the superconducting material and/or cooling temperature is changed/varied may depend on the specific device and its application. As described above, if the superconducting device consists of or comprises a superconducting coil, the one or more local regions may comprise the innermost turn or turns of the coil. If the superconducting device consists of or comprises a single layer solenoid, the one or more local regions may comprise the ends of the solenoid when viewed in the direction along the solenoid's axis. If the superconducting device consists of or comprises a single layer toroid, the one or more local regions may comprise the regions located closest to the centroid of the toroid in each turn of the toroid. If the superconducting device consists of or comprises a multilayer solenoid, the one or more local regions may comprise the regions located at the ends of the solenoid when viewed in a direction along the solenoid's axis and/or the turn or turns closest to the solenoid's axis. If the superconducting device consists of or comprises a multilayer toroid, the one or more local regions may comprise the regions located closest to the centroid of the toroid in each turn of the toroid and/or the inner toroid layers. If the superconducting device consists of or comprises a striated superconducting tape, the one or more local regions may comprise the central filament or filaments of the striated tape. If the superconducting device consists of or comprises a stacked superconducting device comprising a plurality of superconducting layers, each superconducting layer having a plurality of filaments, the one or more local regions may comprise the central filament or filaments of each superconducting layer of the stacked superconducting device. Generally, the location and number of the local regions in which the amount and/or the composition of the superconducting material and/or cooling temperature is changed/varied correspond to the above described regions of reduced critical current density.

In an example, the superconducting device (for example the superconducting device provided by an exemplary method according to an aspect of the invention) may consist of or comprise at least one superconducting cable (for example a tape, a wire, a striated mono or multifilament tape, etc.) or a superconducting layer having a variable cross-section (i.e. a cross-section exhibiting variable cross-sectional area) and/or a variable material composition.

For example, the superconducting cable may exhibit a variable thickness and/or width and/or diameter along the lengthwise direction of the cable (i.e. along the length of the cable or along the longitudinal direction). Alternatively, the superconducting device may comprise a plurality of individual superconducting cables or layers, at least two superconducting cables or layers having different cross-sections. For example, the at least two cables or layers may have different widths, diameters, thicknesses, etc. Each individual superconducting cable may have a substantially uniform or variable width along the lengthwise direction. Different cables may be used in the different regions of the superconducting device.

In an example, the width of the superconducting cable (for example a superconducting tape) may vary along a lengthwise direction of the cable. Alternatively or in addition, cables with different widths may be used in the different regions of the superconducting device. The width of the cable may be increased in regions where higher critical current is needed, for example in regions of increased magnetic field. In another example, cables having greater width than in other regions of the superconducting device may be used in the regions of reduced critical current density. Similar to varying the width of a superconducting tape, the diameter of a superconducting wire may be varied, or wires having different diameters may be used in the different regions of the superconducting device. Instead of or in addition to the width or diameter of the cable, the thickness of the superconducting layer constituting the cable may be locally varied. For example, thicker layers may be used in the regions where higher critical current is needed.

As explained above, if a coil is wound from a superconducting cable having a variable cross-sectional area or from a plurality of superconducting cables having different cross-sectional areas in the different local regions of the coil, it is possible to balance the different critical current densities in the different turns of the coil, hence providing a more uniform use of the superconducting material. The inverse quadratic relation between power loss and critical current means that by balancing the critical current of the turns and achieving a net increase of the critical current of the coil, the overall AC losses are reduced. This is also applicable to other types of superconducting devices, including but not limited to solenoids, toroids, etc.

To compensate for the increase of cross-sectional area in the regions of reduced critical current density, the cross-sectional area in the remaining regions may be decreased (in comparison to an initial, non-optimized superconducting device constituted by a superconductor or superconductors having uniform cross-sectional area). Thus, the otherwise low local critical current (for example the critical current in the innermost turns of the coils) may be increased, leading to an overall increase of the critical current of the device while maintaining the amount of used superconducting material.

In an example, the superconducting device (for example the superconducting device provided by an exemplary method according to an aspect of the invention) may consist of or comprise at least one superconducting cable or layer having a variable chemical composition (for example variable concentrations and/or different types of doping agent) along the lengthwise direction of the cable or layer. The superconducting device may also be a device constituted by or comprising a plurality of individual superconducting cables or layers, at least two superconducting cables or layers having different chemical compositions (for example different concentrations or different types of doping agent). This approach may be combined with varying the cross-sectional area of the superconducting cable(s) and/or layer(s) constituting the superconducting device.

In an example, the superconducting device (e.g. a coil, a solenoid, a toroid, etc.) may comprise a plurality of turns (windings) of at least one superconducting cable (for example a superconducting tape or wire). The cable may have a uniform or a variable width. A different number of windings or different winding density may be used in the different regions of the superconducting device. For example, the density of the windings of the at least one superconducting cable in the one or more local regions of the superconducting device may be lower than the density of the windings in the other regions of the superconducting device. The density of the windings may be varied for example by varying the spacing between the individual windings and/or by using windings of different cross-sectional area.

The superconducting device (for example the superconducting device provided by an exemplary method according to an aspect of the invention) may be a striated superconducting tape constituted by or comprising a plurality of filaments, wherein the widths and/or the thicknesses and/or the material composition of at least two of the filaments are different; and/or the width and/or thickness and/or the material composition of at least one filament varies along the lengthwise direction of the tape.

In addition, it is also possible to use filaments having a variable width along the lengthwise direction of the tape. This may be advantageous in applications in which there is a plurality of local regions of reduced critical current density and/or of increased magnetic field. Still further, locally variable chemical doping (by locally varying the concentration and/or the type of doping material) can be used to optimize superconducting devices (for example High Temperature Superconducting (HTS) devices). For instance, coils can be optimized so that the regions that experience magnetic field with largely different orientations use tapes with doped HTS layers optimized for a particular angle of the applied field. The same principle is applicable to other types of superconducting devices, such as devices consisting of or comprising a solenoid, a toroid, a stack-magnet, etc.

The superconducting device (for example the superconducting device provided by an exemplary method according to an aspect of the invention) may comprise a plurality of superconducting layers. An example of such superconducting device is a stacked magnet being for example assembled from a plurality of striated superconducting tapes. Each layer of the superconducting device may have a plurality of filaments. At least one of the layers may comprise filaments having different widths and/or thicknesses and/or chemical compositions. Alternatively or in addition, filaments of at least two of the different layers may have different widths and/or thicknesses and/or chemical compositions. As explained above, the widths and/or the thicknesses of the filaments in each layer or in the different layers can be modified in the one or more regions of the superconducting device corresponding to the regions of increased magnetic field and/or of reduced critical current density during pulsed field magnetization.

Further, the superconducting device may include a plurality of heat sinks arranged in or in the vicinity of said one or more local regions (corresponding to the above mentioned local regions of reduced current density in said superconducting device).

The computational aspects of the proposed method can be implemented in digital electronic circuitry, in computer hardware, firmware, software, or in combinations thereof. Thus, according to an aspect, there is provided an apparatus for optimizing or producing a superconducting device comprising a computing device configured to perform the method according to any of the above described aspects and examples.

The apparatus may further have an input device for inputting (initial) data of the superconducting device which is to be optimized/modified. The data may include parameters of the superconducting device, such as the form and dimensions of the superconducting device (width, diameter, length, cross-section), type and dimensions of the superconducting cables (e.g. tapes or wires) constituting the superconducting device, number of turns/windings, etc. An initial distribution of the amount and/or composition of the superconducting material and/or of the cooling temperature may be determined based on these data. Alternatively, the input data may include an initial spatial distribution of the amount and/or composition of a superconducting material and/or of the cooling temperature across the superconducting device.

The apparatus may also include an output device for outputting data of the optimized/modified superconducting device. The output data may include a (new) spatial distribution of the amount and/or composition of superconducting material and/or the cooling temperature across the superconducting device obtained by the above described method. The superconducting device with the newly determined spatially varying distribution may be manufactured by any known manufacturing method and manufacturing means.

Further, the apparatus may include a memory device for storing the initial and/or output data of the superconducting device.

To provide for interaction with a user, the apparatus may further have a display device, such as a monitor or an LCD screen for displaying information to the user and a keyboard, a pointing device such as a mouse or a trackball, a touch-sensitive screen, or any other device by which the user may provide input to computer system. The computing device can be programmed to provide a graphical user interface through which the computer program(s) interact(s) with the user.

According to a further aspect, there is provided a computer program product, for example tangibly embodied in a machine-readable storage device, for execution by a programmable processor, said computer program product configured to carry out the method according to an aspect of the invention.

Advantages of the method, apparatus and superconducting device according to aspects of the invention may include one or more of:
Currents of larger amplitudes can be transported by using the same amount of superconducting material as in conventional superconducting devices;
Larger magnetic fields can be produced using the same amount of superconducting material as in conventional superconducting devices;
A current of the same amplitude can be transported with a smaller amount of superconducting material as compared to conventional superconducting devices;
A magnetic field of the same amplitude can be produced with a smaller amount of superconducting material as compared to conventional superconducting device;
In the case of AC current transport, energy losses can be reduced;
In the case of AC magnetization, energy losses can be reduced.

In some examples, the overall critical current may be increased by at least about 15%, and the magnetic field may be increased by at least about 15% using the same amount of superconducting material. It is also possible to reduce the amount of superconducting material needed to build a superconducting device without reducing its critical current or produced field. In some examples it is possible to reduce the AC losses of the device by at least about 28% when using the same amount of superconducting material. It is also possible to reduce the amount of superconducting material needed to build a superconducting device without increasing its AC losses.

BRIEF DESCRIPTION OF THE DRAWINGS

These and other aspects will now be described in detail with reference to the following drawings:

FIG. 1 shows a conventional rectangular tape having a uniform cross-section used for winding high temperature superconducting (HTS) coils;

FIG. 2 shows a conventional coil assembled from a rectangular HTS tape, wherein FIG. 2A is a perspective view of the coil, FIG. 2B shows schematically the coil's cross-section in a plane including the coil's axis 122, FIG. 2C shows schematically half the cross-section and FIG. 2D shows an abstraction of the coil (for conceptual purposes);

FIG. 3 shows an M-shaped superconducting tape for winding M-shaped superconducting coils;

FIG. 4 shows a tiling pattern for cutting tapes for M-shaped coils from a rectangular tape;

FIG. 5 shows various M-shaped tapes and their characteristic points, wherein FIG. 5A shows an embodiment of an M-shaped tape and FIG. 5B shows a different embodiment of an M-shaped tape;

FIG. 6 shows an M-shaped superconducting coil assembled from a superconducting M-shaped tape, wherein FIG. 6A is a perspective view of the M-shaped coil, FIG. 6B shows the coil's cross-section in a plane including the coil's axis 182, FIG. 6C shows half the cross-section and FIG. 6d shows an abstraction of such a coil (for conceptual purposes);

FIG. 7 shows various superconducting coils assembled from tapes having varying widths, wherein

FIG. 10 shows a conventional multilayer superconducting solenoid in FIG. 10A and an optimized multilayer superconducting solenoid in FIG. 10B;

FIG. 11 shows a conventional multilayer superconducting toroid in FIG. 11A and two exemplary optimized multilayer superconducting toroids in FIG. 11B and FIG. 11C;

FIG. 15 shows a coil made from a superconducting tape exhibiting a non-uniform doping, wherein FIG. 15A shows the streamlines in the tapes of a circular coil and FIG. 15B shows a blueprint for using a superconducting tape with a variable doping;

FIG. 17 shows a lift factor as a function of the applied magnetic field in Tesla for different temperatures, wherein

FIG. 19 shows the magnetic field of a conventional superconducting coil in FIG. 19A and of an optimized superconducting coil in FIG. 19B;

DETAILED DESCRIPTION OF PREFERRED EMBODIMENT

Figure 7A:
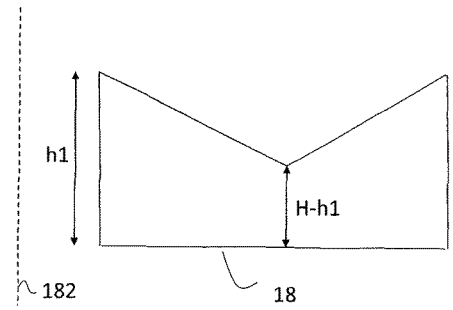
FIG. 7A shows a single M-shaped coil.
Figure 7B:
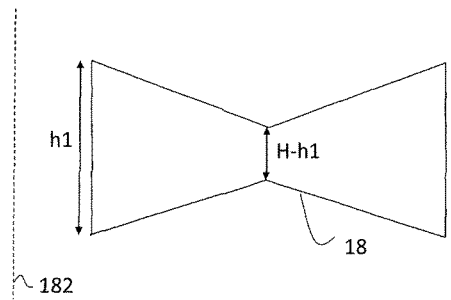
FIG. 7B shows a single bow-tie shaped coil.
Figure 7C:
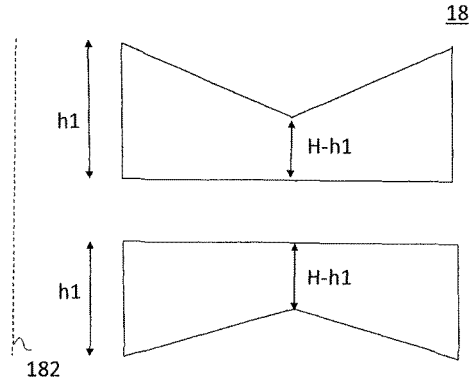
FIG. 7C shows a back to back array of M-shaped coils.
Figure 7D:
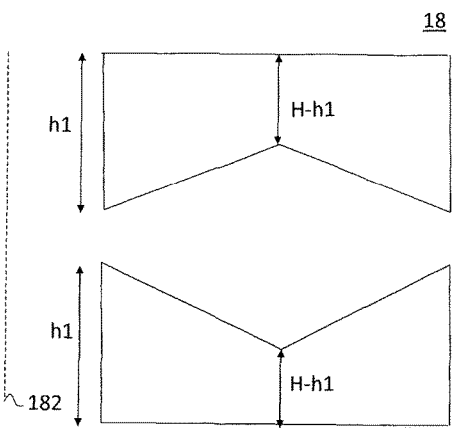
FIG. 7D shows a front to front array of M-shaped coils.
Figure 7E:
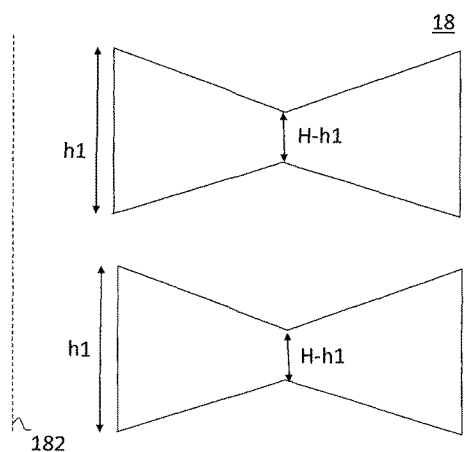
FIG. 7E shows an array of bow-tie shaped coils.

Throughout the drawings, the same reference signs are used for the same or similar elements. It should be understood that even though embodiments are separately described, single features thereof may be combined to additional embodiments.

Coils Assembled from Superconducting Tapes

In manufacturing superconducting devices such as magnetic coils, solenoids, toroids, etc., the superconducting cable from which the devices are assembled may be formed in the shape of a thin tape. For example, the thin tape may be composed of a mono- or multi-filament composite superconductor including individual superconducting filaments which extend along substantially the length of the multi-filament composite conductor (i.e. along the lengthwise direction). The filament(s) may be surrounded by a matrix-forming material, which is not a superconducting material. The superconducting filaments and the matrix-forming material may be encased in an insulating layer. Other superconducting tapes or wires are also known in the art and may be used in the examples of the invention.

FIG. 1 shows schematically a conventional rectangular superconducting tape 10 having a uniform cross-section used for winding high temperature superconducting (HTS) coils, such as pancake or double-pancake type of coils. For a better understanding the tape is not shown to scale. Typical dimensions of the tape are width H=12 mm and length L about 18 m for a tight 50 turn coil with a 5 cm inner radius. The thickness of the tape ranges from about 50 to 100 micrometers including a superconducting layer of about 1 to 10 micrometers in thickness. Other dimensions are also possible.

FIG. 2 is a schematic representation of a conventional coil 12 assembled from a rectangular HTS tape with uniform width, wherein FIG. 2A is a perspective view of the coil, FIG. 2B shows schematically the coil's cross-section in a plane including the coil's axis 122, FIG. 2C shows schematically half the cross-section and FIG. 2D shows an abstraction of the coil (for conceptual purposes). R1 denotes the inner radius of the coil and cg denotes the coil gap (i.e. the gap between the turns).

In an example of the invention, a coil may be assembled from a tape having a variable cross-section (i.e. a variable cross-sectional area). The shape of the tape may be for example an M-shape. FIG. 3 shows the basic shape of an M-shaped tape 14 that may be used for winding M-shaped coils. As shown in FIG. 3, the width of the M-shaped tape 14 reduces gradually in a lengthwise direction of the tape between a first predetermined point P1 and a second predetermined point P2 and increases gradually between the second predetermined point and a third predetermined point P3.

A tape of such shape may be directly manufactured without any cutting involved. Alternatively, M-shaped tiles may be cut from an original rectangular superconducting tape, preferably in a way that no superconducting material is discarded.

FIG. 4 shows an exemplary tiling pattern 16 that may be used to cut tapes for M-shaped coils from a rectangular superconducting tape. The overall length L and the width H of the (uncut) rectangular tape may be the same or similar to those of the rectangular tape shown in FIG. 1. The tape may be further specified by two additional parameters d and h1, wherein d denotes the distance in lengthwise direction from the first predetermined point P1 to the second predetermined point P2 and h1 denotes the width of the tape at point P2 (i.e. at the "apex" of the M-shape). Parameters d and h1 may be determined considering the specific application and may depend on several factors such as the current and the inner radius of the coil among others.

FIG. 5 shows in more detail two possible M-shaped tapes for coil winding and their characteristic points. The tapes may be cut from a rectangular tape, such that no superconducting material is wasted. The M-shaped tape shown in FIG. 5A is similar to the M-shaped tape shown in FIG. 3. In this tape the points (0,h1) and (d,h1) are connected by a straight line. Similarly, the line linking points (d,h1) and (L,h1) is a straight line. However, the lines linking points (0,h1) and (d,h1) and points (d,h1) and (L,h1), respectively, do not necessarily have to be straight lines. For a material conservation to take place, it is only necessary that the line linking points (0,h1) and (d,h1) is an "odd" function centered in point (d/2,H/2) and that the line linking points (d,h1) and (L,h1) is an "odd" function centered in point (L-d/2,H/2). An example of such tape is shown in FIG. 5B.

FIG. 6 shows schematically an M-shaped coil 18 assembled from an M-shaped tape, wherein FIG. 6A is a perspective view of the M-shaped coil, FIG. 6B shows the coil's cross-section in a plane including the coil's axis 182, FIG. 6C shows half the cross-section and FIG. 6D shows an abstraction of such a coil (for conceptual purposes). In FIG. 6 R1 denotes the inner radius of the coil and cg the coil gap (i.e., the gap between the turns).

Other coil designs, for which there may be a comparatively low waste of superconducting material are also possible.

FIG. 7 shows various exemplary coils 18 assembled from superconducting tapes having varying width in a lengthwise direction. For simplicity only the abstract shape of the coil is shown. Further, to aid visualization the parameter "d" is not presented. FIG. 7A shows a single M-shaped coil and FIG. 7B shows a single bow-tie shaped coil. The bow-tie shaped coil may be realized without wasting superconducting material by, for example, winding a single M-shaped coil and rearranging the windings by gently pushing from below (i.e. from the side opposite to the M-shaped cut). FIG. 7C shows a back to back array of M-shaped coils, FIG. 7D shows a front to front array of M-shaped coils and FIG. 7E shows an array of bow-tie shaped coils. Larger arrays can be produced by using both bow-tie and M-shaped coils in different orientations.

Depending on the application, the superconducting tape may be cut or formed in a more-complex shape, for example including a plurality of regions of increasing width and a plurality of regions of decreasing width.

The above design principles may be extended to single and multi-layer solenoids and toriods wound from superconducting tapes.

Single Layer Solenoids

Figure 8A:
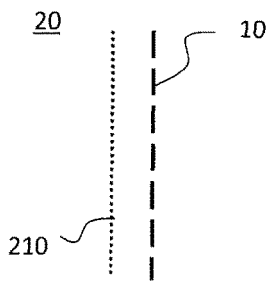
FIG. 8 shows a conventional single layer superconducting solenoid in FIG. 8A and an optimized single layer superconducting solenoid in FIG. 8B.
Figure 8B:
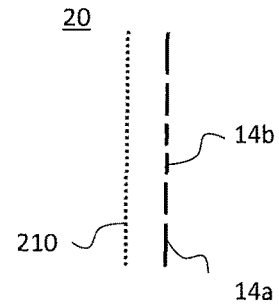

FIG. 8 shows schematically an axisymmetric model of a single layer solenoid 20 having a symmetry axis 210, wherein FIG. 8A shows a conventional single layer solenoid and FIG. 8B shows a single layer solenoid according to an example of the invention. The conventional solenoid is assembled from a rectangular tape 10 of uniform width. The solenoid shown in FIG. 8B is assembled from an M-shaped tape 14 having variable width, with a wider region 14a being used in the outer (end) turns of the solenoid and a narrower region 14b being used in the central turns. In the example shown in FIG. 8B, each rectangular tape has a constant thickness along the longitudinal direction (i.e. along the lengthwise direction of the tape). However, it is possible to use rectangular tapes with a variable thickness along the longitudinal direction.

Single Layer Toroids

Figure 9A:
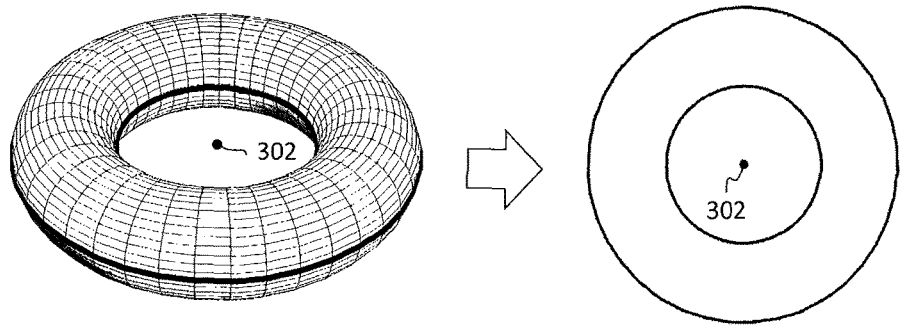
FIG. 9 shows a cross-sectional model of a single layer toroid in FIG. 9A, a conventional single layer superconducting toroid in FIG. 9B and an optimized single layer superconducting toroid in FIG. 9C.
Figure 9B:
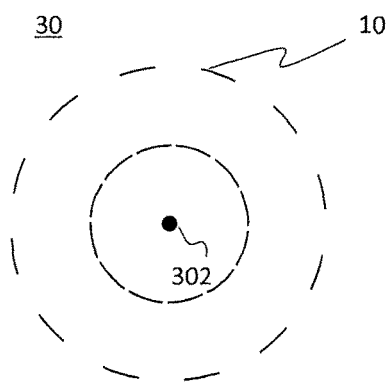
Figure 9C:
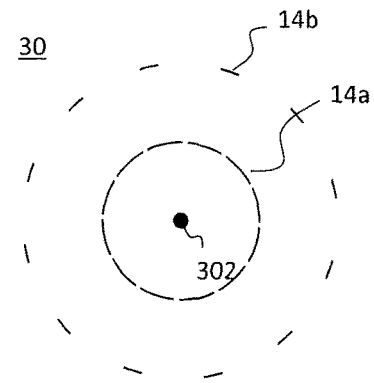

FIG. 9 shows schematically a single layer toroid 30. For ease of explanation, a cross-sectional model (see FIG. 9A) is used. Here, a cut plane perpendicular to the toroid's symmetry axis and passing through its centroid 302 is used. FIG. 9B shows a conventional single layer toroid and FIG. 9C shows a single layer toroid according to an example of the invention. The number of depicted turns is used for illustrative purposes only and does not necessarily correspond to the actual number of turns used in a single layer toroid. The conventional single layer toroid is assembled from a rectangular tape 10 of constant width. The single layer toroid according to an example of the invention uses a rectangular tape 14 with a variable width, where wider sections 14a of the tape are used close to the centroid 302 of the toroid and narrower sections 14b are used in the regions far from the centroid 302 of the toroid. In this example, the tape has a constant thickness along the longitudinal direction (i.e. along the lengthwise direction of the tape). However, it is possible to use rectangular tapes with a variable thickness along the longitudinal direction.

Multi-Layer Solenoids

FIG. 10 shows an axisymmetric model of a multilayer solenoid 40 having a symmetry axis 410, wherein FIG. 10A shows a conventional multilayer solenoid and FIG. 10B shows a multilayer solenoid according to an example of the present invention. The conventional multilayer solenoid shown in FIG. 1 OA uses rectangular tapes 10 of uniform width, all tapes having the same width. The multilayer solenoid shown in FIG. 10B uses tapes of a variable width, said tapes being wider 14a in the top and bottom (i.e. end) parts of the solenoid and narrower 14b in the central part. Additionally the innermost and the outermost layers may have wider turns. In the example shown in FIG. 10B, a different or the same number of tapes per layer (with or without constant spacing among tapes in each layer) may be used. Further, tapes with a variable thickness along the longitudinal direction (i.e. along the lengthwise direction of the tape) may be used.

Multi-Layer Toroids

FIG. 11 shows a multilayer toroid 50 having a centroid 502. Here, a cut plane perpendicular to the toroid's symmetry axis and passing through its centroid 502 is used. FIG. 11A shows a conventional multilayer toroid, FIG. 11B shows a multilayer toroid according to one example of the invention, and FIG. 11C shows a multilayer toroid according to another example of the invention. In order to aid the visual representation, the number of tapes displayed does not correspond to the actually used number.

The conventional multilayer toroid as illustrated in FIG. 11A comprises a plurality of layers, each layer constituted by rectangular tapes 10 having the same, constant width. Further the widths of the tapes in all layers are the same. In the multilayer toroid shown in FIG. 11B tapes of variable width are used, so that wider regions 14a are used in the innermost layer, while narrower regions 14b are used in the following layers and finally, wider regions 14c are used in the outermost layers. In the multilayer toroid shown in FIG. 11C several layers of tapes of variable width are employed, with the outer layers being constituted by narrower regions 14d of the tapes and the inner layers being constituted by wider regions 14e of the tapes. In the examples shown in FIGS. 11B and 11C, each tape has a substantially constant thickness along the longitudinal direction (i.e. along the lengthwise direction of the tape). However, it is possible to use rectangular tapes with a variable thickness. Further, a different or the same number of tapes per layer (with or without constant spacing among tapes in each layer) may be used.

Superconducting Striated Tapes

As is known in the art, superconducting tapes may be striated to reduce the AC losses of the superconducting devices (such as coils, solenoids or cables among others) assembled from such tapes when exposed to AC fields. The striation process creates small grooves in the surface of the tape, hence breaking the superconducting layer. However, the tape remains mechanically connected, retaining most of its mechanical stability. Conventionally, the striation is carried out constructing filaments of the same, uniform width.

FIG. 12 shows a top view of an exemplary striated superconducting tape 60 constituted by a plurality of filaments 602. FIG. 12A shows a conventional striated superconducting tape constituted by filaments 602 of the same, constant width. For a striated tape with filaments 602 of uniform width the filaments in the center of the tape experience higher AC losses than the filaments close to the tape's edge. Therefore, it is proposed to use filaments of different widths with wider filaments in the edges of the tape. This will increase the loss in the edge filaments, but will also reduce the losses in the central filaments, hence reducing the overall AC losses.

Figure 12A:
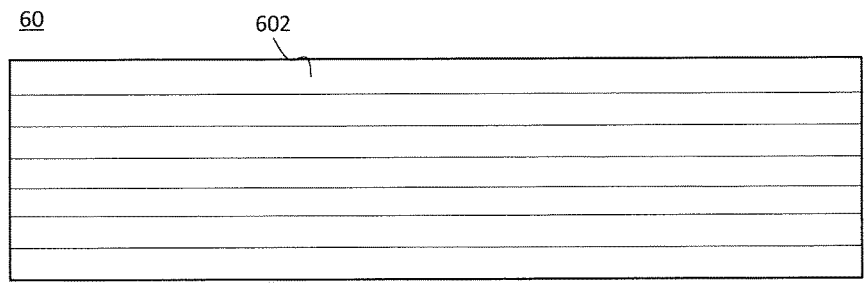
FIG. 12 shows a conventional striated superconducting tape in FIG. 12A and three exemplary optimized striated superconducting tapes in FIGS. 12B to 12D.
Figure 12B:
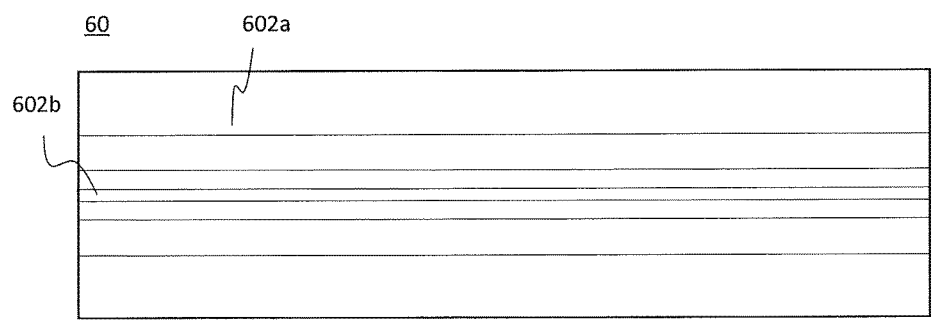
Figure 12C:
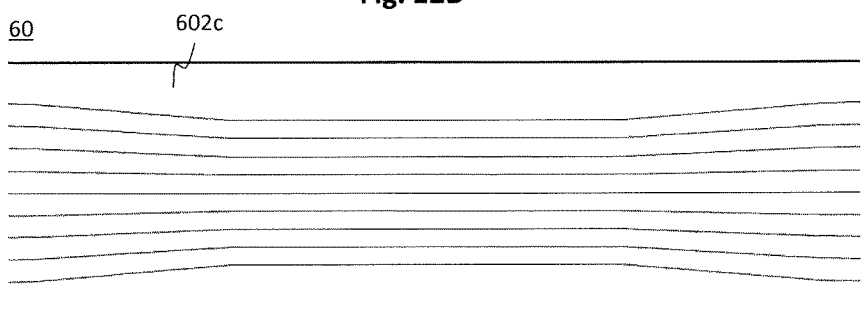
Figure 12D:
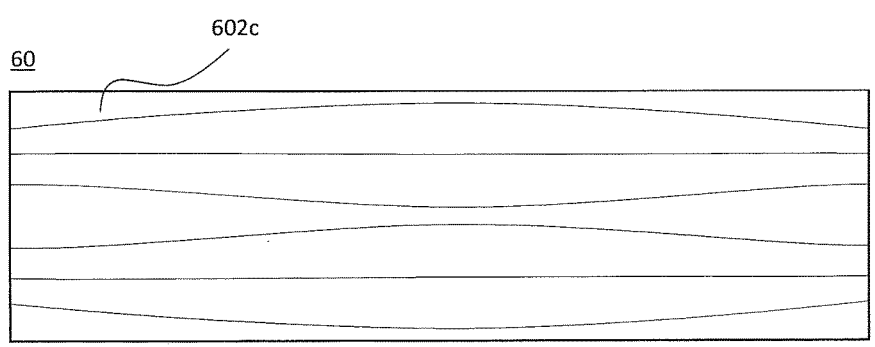

FIGS. 12B to 12D show exemplary striated tapes with filaments 602a and 602b having different widths. In all examples, the superconducting tape is striated by forming a plurality of grooves (shown as thin lines) by a laser. In the example shown in FIG. 12B, each of the filaments has a constant width and thickness along the lengthwise direction of the tape, with the outermost filaments 602a having greater width than the innermost filaments 602b. For simplicity, width optimization of only the outermost filament is presented here, but the priciple is similar when considering optimizing the width of several filaments.

Depending on the intended application, it is possible to have different electromagnetic environments in the same device (consider for instance the innermost and the outermost turns of coils, or the turns at the ends of solenoids and the ones in the central regions) leading to more than one region of reduced critical current density and/or of increased magnetic field. In such cases, it is possible to design a striation pattern in such a way that the AC losses are reduced as much as possible in the overall superconducting device.

Generally, the optimal width of the external (outermost) filament is related to the amplitude of the magnetic field applied. In the case presented above (see FIG. 12B), for an externally applied field with amplitude of 10 mT, the losses can be minimized by using an outermost filament which is 850 μm wide. For a field with amplitude of 15 mT, the optimal width of the external filaments would be 610 μm. Therefore, in cases where the amplitude of the externaly applied magnetic field changes along the tape's length, the width of the outermost filament can be changed accordingly.

FIG. 12C shows an exemplary layout (not to scale) for the filaments in a tape exposed to a non-uniform magnetic field such that it has a lower amplitude at the tape's central region. In this example, the width of the outermost filament 602c is not constant but varies along the lengthwise direction of the tape.

FIG. 12D shows another exemplary striation pattern (not to scale) of a superconducting tape with filaments of varying width designed so that the magnetization loss is reduced in a plurality of regions of the superconducting tape.

In the examples shown in FIGS. 12C and 12D, the width of at least one individual filament (for example the outermost filament) 602c varies along the lengthwise direction (i.e. the direction along the length of the tape). Further, filaments of different widths are used (with the innermost filaments generally having lower width than the outermost filaments). The laws of variation of the width of each filament along a lengthwise direction depend generally on the applied magnetic field. As illustrated in FIG. 12D, the laws of variation of the width along the lengthwise direction of the tape may be different for the different filaments. Accordingly, the widths of the filaments may vary both along the lengthwise and the transverse (width) direction of the tape (i.e. the direction perpendicular to the longitudinal direction of the tape).

A common characteristic of the designs described above is the redistribution of the superconducting material, so that the overall critical current is increased and/or the AC losses of the superconducting device are reduced. For example, in the case of devices to which a transport current is applied, more superconducting material is allocated in the region(s) which experience(s) the highest reduction in critical current density. For instance, in the case of an inductive coil in a self-field, this means that more material is allocated in the central region of said coil, for example by varying the width of the superconducting tape from which the coil is assembled. In case of striated tapes or stacks of them, the superconducting material is redistributed so that the reduction of losses in some filaments and/or parts of them is higher than the increase of losses in some other filaments and/or parts of them, leading to an overall reduction of the AC losses of the superconducting device. The material may be redistributed for example by varying the width of the filaments constituting the superconducting device in a transverse and/or lengthwise direction of the tape.

Another method for designing superconducting devices is to vary the thickness of the superconducting (for example HTS) layer along the length of the superconducting tape. For example, a larger amount of superconducting material may be deposited in the part of the tape that will need it the most.

In a conventional superconductor (e.g. a superconducting tape) produced by conventional Ion Beam Assisted Deposition (IBAD) process, the fabrication of the superconductor involves a deposition of a superconducting layer (e.g. HTS layer) on top of a substrate. The HTS layer can be grown in different thicknesses. Typically, layers of 1 micrometer in thickness are formed in most superconductors. Thicker layers can be grown at the expense of a longer deposition times, while thinner layers can be formed by reducing the deposition time.

Figure 13A:
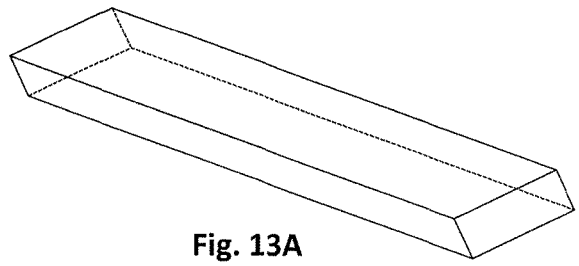
FIG. 13 shows a conventional superconducting tape having a superconducting layer with uniform thickness in FIG. 13A and an optimized superconducting tape having a superconducting layer with varying thickness FIG. 13B.
Figure 13B:
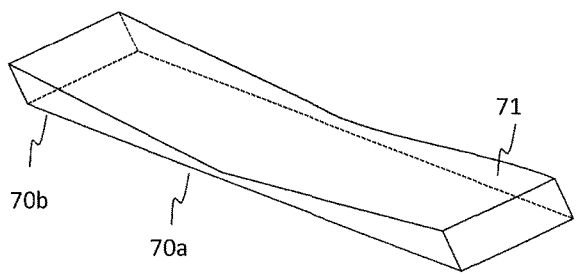

FIG. 13 shows a perspective view of a superconducting tape 70, for example a superconducting tape for winding a circular coil. The conventional superconducting tape shown in FIG. 13A has a superconducting layer with a constant thickness. The superconducting tape according to an example of the invention shown in FIG. 13B has a superconducting layer 71 having a variable thickness, with an M-shaped pattern being formed across the thickness of the superconducting layer. In other words, the superconducting layer according to this example exhibits a variable thickness, with the thickness at the central portion 70a of the tape being lower than the thickness at the edge portions 70b of the tape. The superconducting layer 71 may be formed for example by an IBAD process or a rolling-assisted biaxially textured substrate (RABiTS) process among other processes.

By forming a superconducting layer having a variable thickness as shown in FIG. 13B, a superconducting tape, for example, for winding a coil may be produced. Of course, the same design principle can be employed for producing tapes having a variable thickness for use in other superconducting devices, such as other coil designs (racetrack, saddle, etc.), solenoids, toroids, etc. Further, the thickness of the layer may vary according to a different pattern, depending on the specific design and application.

It is of course possible to vary both the width and the thickness of the superconductor layer.

Alternatively or in addition to varying the amount of superconducting material, for example by varying the cross-sectional area of a superconducting layer, superconducting cable or superconducting filament, the composition of the superconducting material can be spatially varied. For example, the composition of the HTS layer tape can be modified to affect the local critical current density $J_c(B)$ characteristic. Various techniques for modifying the composition of the superconducting layer may be employed, including for example the techniques disclosed in the publication N. D. Khatri et al. "*Pre fabricated nanorods in RE-Ba-Cu-O superconductors*" SUST 26, 8 doi:10.1088/0953-2048/26/8/085022 and the references cited therein.

Figure 14:
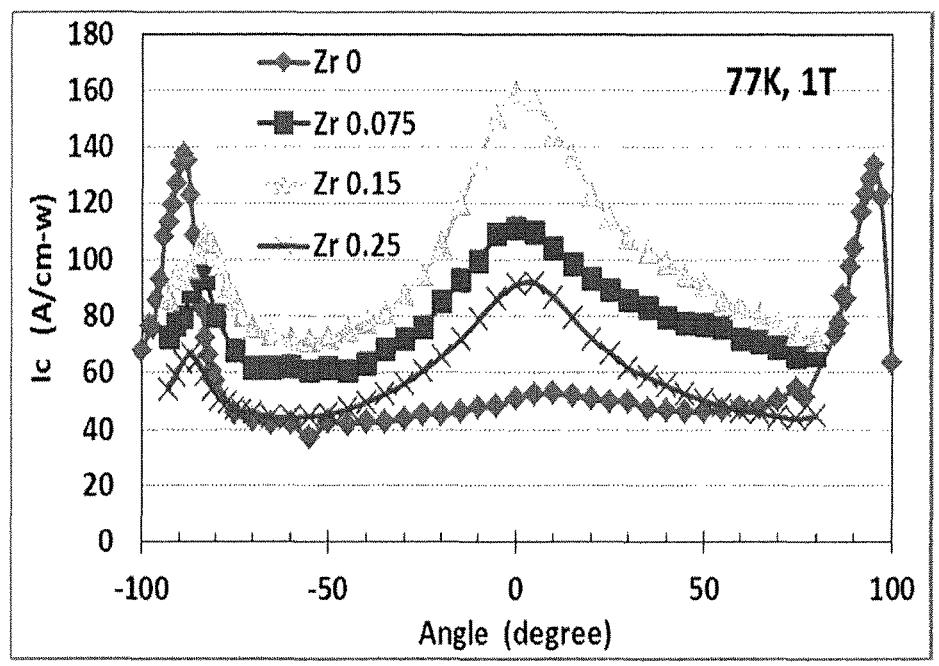
FIG. 14 shows the magnetic field orientation dependence of the critical current $I_c$ of tapes doped with different concentrations of Zr.

FIG. 14 shows the magnetic field orientation dependence of the critical current $I_c$ of rectangular tapes made of (RE) BCO superconducting material (RE stands for rare earth such as Y, Ga, Sm, etc.) doped with different concentrations of Zr, produced by Super Power Inc. The angle (in degrees) is measured with respect to the superconducting tape's surface. As shown in FIG. 14, there is a tradeoff between the regions of peak performance. Thus, a given concentration of Zr (in this case Zr 0.15) allows for a larger critical current $I_c$ when the field is applied at an angle close to 0 deg, but the same concentration reduces the critical current $I_c$ at angles close to 90 deg.

Figure 15:
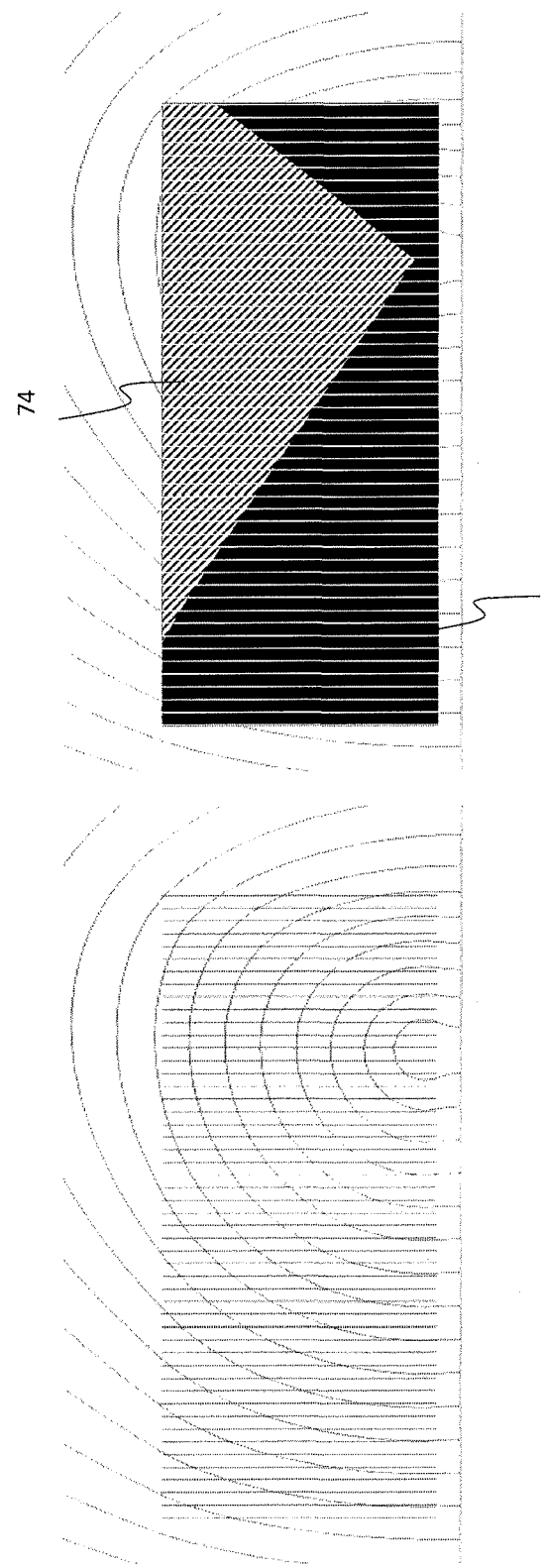

According to an example of the invention, non-uniform doping can be used to optimize superconducting devices. For instance, coils can be optimized, so that the regions that experience magnetic field with largely different orientations employ tapes with doped HTS layers optimized for the particular angle of the applied field. FIG. 15 illustrates an example of a superconducting coil exhibiting non-uniform doping. The axis of the coil (not shown) is at the left of each image. FIG. 15A shows the streamlines in the tapes of a circular coil and FIG. 15B shows a blueprint for using a superconducting tape with a variable doping, which is optimized for parallel and for perpendicular fields in such coil. In FIG. 15B the solid pattern shows a region 72 with a doping that allows a higher critical current under parallel magnetic field. In the doping example of FIG. 14, this corresponds to the doping labelled Zr 0. In a similar fashion, the dashed region 74 has a doping that allows a higher critical current under perpendicular magnetic field. In the doping example of FIG. 14, this corresponds to the doping labeled Zr 0.15.

Stacked Tape Magnets

Use of filaments having different widths and/or thicknesses as well as tapes with varying doping concentration can be advantageous for pulsed field magnetization of stacks of tapes. In such applications, filaments of different widths, tapes with superconducting layers of varying widths and/or thicknesses and/or tapes with varying doping concentration may reduce the hysteretic losses related to the pulsed fields applied to the stack. The principle behind this is the same as described above for the case of a striated tape.

Figure 16:
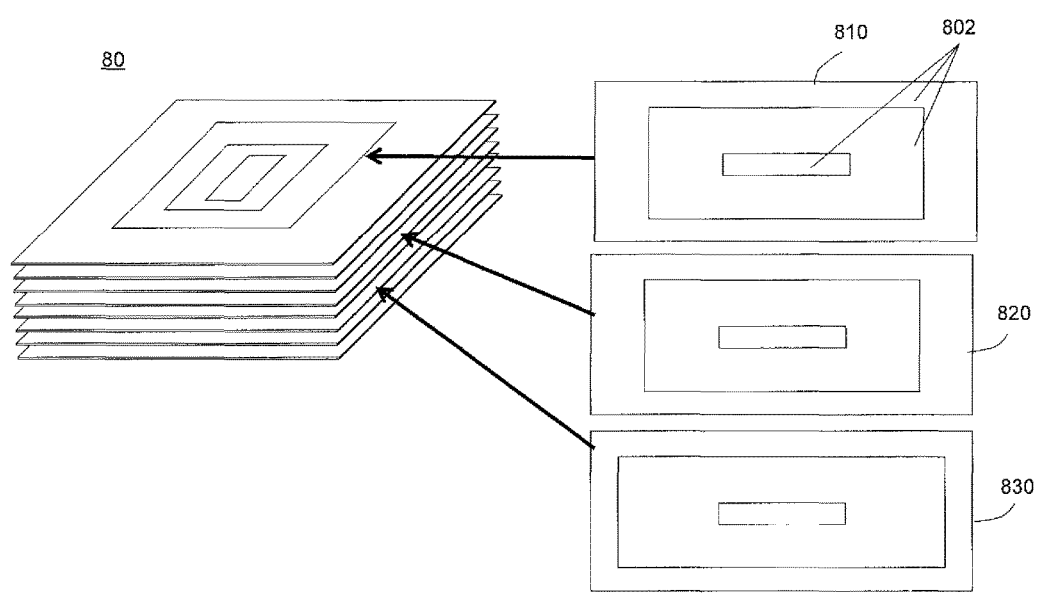
FIG. 16 shows a stack of striated superconducting tapes having filaments of different widths.

FIG. 16 shows a stack 80 of superconducting tapes 810, 820, 830 with filaments 802 of different widths, the lines showing the regions (e.g. grooves) that have been striated with a laser. As described above, the width of the filaments 802 is selected so as to reduce the overall AC magnetization loss. Of course, in order to reduce the overall AC magnetization loss, it is also possible to use two further alternative or complementary strategies: use of tapes with superconducting layers of varying thicknesses and/or use of tapes with varying doping concentrations.

Superconducting Devices with Locally Variable Temperature

In addition or alternatively to the above approaches based on locally increasing or decreasing the amount of the superconducting material and/or locally varying the composition of the superconducting material, the overall critical current may be enhanced thermally, i.e. by using local temperature variation to increase the local critical current density of superconducting devices.

Generally, for lower operating temperatures the critical current $I_c$ of a superconductor (for example a superconducting tape) is enhanced by a so called "lift factor" ($l_f$). The lift factor $l_f$ at a given temperature T for a superconducting material whose critical temperature is above 77K can be defined as:

$$l_f = I_c(T)/I_c(77K)$$

Similar expressions for lift factors can be obtained for other superconducting materials with lower critical temperature by considering a different reference temperature.

Figures 17A, 17B:
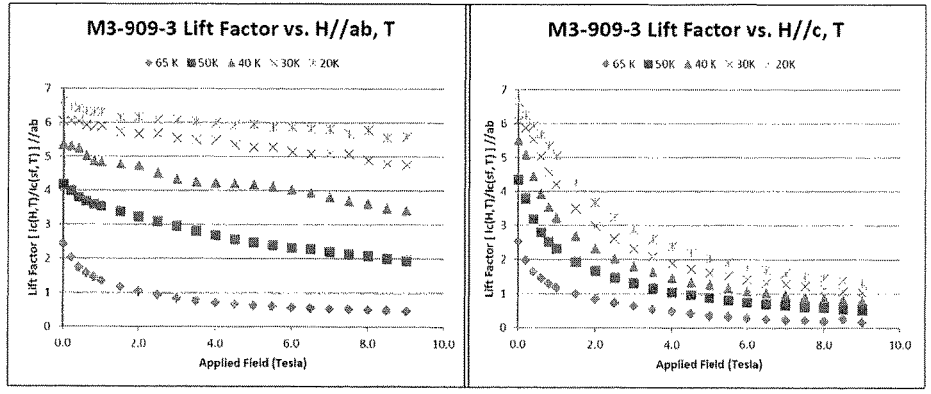
FIG. 17A shows the lift factor for the case of an applied magnetic field that is parallel to the "ab" plane of the superconducting film and FIG. 17B shows the lift factor for the case of an applied magnetic field that is parallel to the "c" axis of the superconducting film.

FIG. 17 shows the lift factor as a function of the applied magnetic field in Tesla for different temperatures (65K, 50K, 40K, 30K and 20K) for high temperature superconducting coated conductors as reported on http://www.superpower-inc.com. FIG. 17A shows the lift factor for the case of an applied magnetic field that is parallel to the "ab" plane of the superconducting film (i.e. parallel to the tape's surface) and FIG. 17B shows the lift factor for the case of an applied magnetic field that is parallel to the "c" axis of the superconducting film (i.e. perpendicular to the tape's surface). As seen from FIG. 17, it is possible to perform a simple linear interpolation between the points connecting the lift factor at 77K and at 65K, which yields:

$$l_f(T) = -0.125T + 10.625.$$

Hence for a temperature of 76 K, a lift factor of 1.125 may be obtained. Similar results can be obtained for the case of an externally applied field.

As seen from above, a small variation in the cooling temperature yields a relatively large lift factor. This fact can be advantageously exploited in the design of superconducting devices. In an example, the cooling system may be configured such that it provides an enhancement of the critical current density in the regions where for example the magnetic field produces a reduction. For example, it is possible to design a coil in such a way that heat sinks are located in the vicinity of the inner turns, so that the small difference in cooling compensates for the higher magnetic field. For example, if the regions where the magnetic field produces a reduction are cooled to 76 K, a lift factor of 1.125 is obtained. Taking into account that the loss is at least proportional to $1/I_c^2$, a reduction in AC losses of 21% is expected in regions of the device that otherwise would be at 77K.

The same principle can be applied to other superconducting devices (such as for example solenoids, toroids, stacked-tape magnets, etc.) and to other superconducting materials. By placing the heat sinks at or in the vicinity of the regions of reduced critical current density of such devices, these regions will experience a higher temperature reduction, therefore achieving an overall larger critical current density and a consequent reduction of the AC losses.

Round Conductors

The above examples deal with superconductors in the form of tapes and with superconducting devices produced from such tapes. However, the principle of the compensation of the local critical current $I_c$ reduction due to the magnetic field by a local variation of the amount or composition of superconducting material or by a local variation of the temperature may be applied to other types of superconductors, for example to round conductors or wires. In this way, large magnets assembled from such conductors can be optimized to reduce their mass and volume and/or to increase their critical current and/or to reduce their AC losses.

Figure 18:
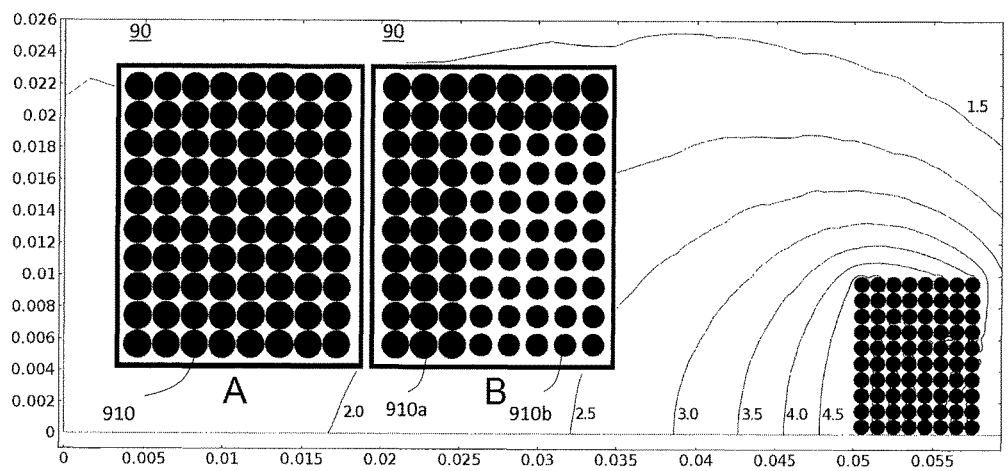
FIG. 18 shows superconducting coils (conventional and optimized)

FIG. 18 shows an exemplary superconducting coil 90 assembled from a round superconductor wire 910, wherein a conventional coil A is shown on the left and an optimized coil B according to an example of the invention on the right. Further shown in FIG. 18 is the magnetic flux density in the superconducting coil (upper half plane of axisymmetric representation). The labels next to the contour lines are the corresponding values (in Tesla) of the amplitude of the magnetic flux density.

The windings of the conventional coil exhibit uniform cross-sections, i.e. wires of the same caliber are used. In the optimized coil B wires of two different calibers 910a and 910b are used. Both configurations produce the same magnetic field in the coil's axis. However, the optimized coil requires less superconducting material. Alternatively, it is possible to design the coil such that with the same amount of superconducting material a larger field is produced.

By using wires of different calibers (diameters), instead of a wire with a single caliber for winding superconducting coils, it is possible to increase both the coil's critical current $I_c$ and the magnetic field while using the same amount of superconducting material. Further, it is also possible to match the critical current $I_c$ and the central magnetic field using less superconducting material. Still further, higher magnetic fields for the same mass and volume would be provided by denser packing in the region with thinner wire. The same applies to other types of superconducting devices, such as solenoids, toroids, etc.

Below are simulation results obtained for various optimized superconducting devices.

EXAMPLE 1

In a first example, a conventional double pancake coil made of 50 turns of superconducting tapes with inner radius of 5 cm was optimized by varying the local critical current. The coil was optimized by using a pair of "M-shaped" coils in a front to front array arrangement. The table below summarized the parameters of the original (conventional) coil and the optimized coil.

| Original (Conventional) coil | Optimized coil using front-to-front "M-shape" coils arrangement |
| --- | --- |
| $I_C(DC)$ = 65.11 A, central $|B|$ = 0.118 T $I_C(AC)$ = 71 A AC losses at 71 A ---> 0.3047 J/cycle | $I_C(DC)$ = 79.24 A, central $|B|$ = 0.141 T $I_C(AC)$ = 85 A AC losses at 71 A ---> 0.2202 J/cycle AC losses at 77.12 A ---> 0.3013 J/cycle AC losses at 85 A ---> 0.4419 J/cycle |

FIG. 19 shows the magnetic field (in Tesla) for the original coils (FIG. 19A) constituting the double pancake coil and the "M-shaped" coils (FIG. 19B) at their respective critical currents $I_c(DC)$. Both configurations use the same amount of superconducting (HTS) tape. The overall critical current for the original coils is I=65.11 A, whereas the overall critical current for the optimized coils using "M-shaped" coils the overall critical current is I=79.24 A.

Figure 20A:
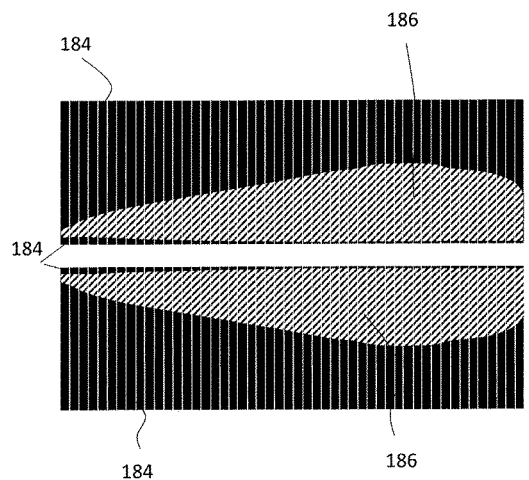
FIG. 20 shows the normalized current density in a conventional superconducting coil in FIG. 20A and in two exemplary optimized superconducting coils in FIG. 20B and FIG. 20C)
Figure 20B:
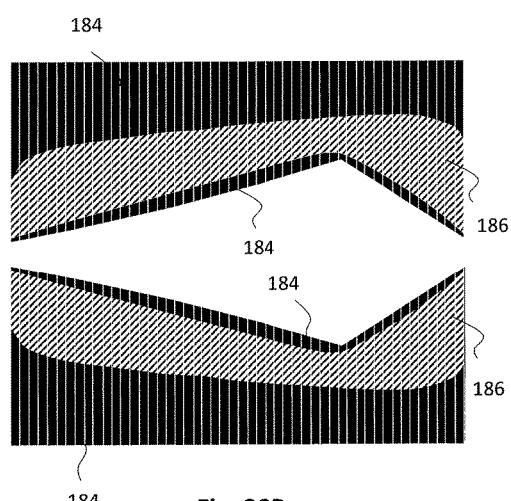
Figure 20C:
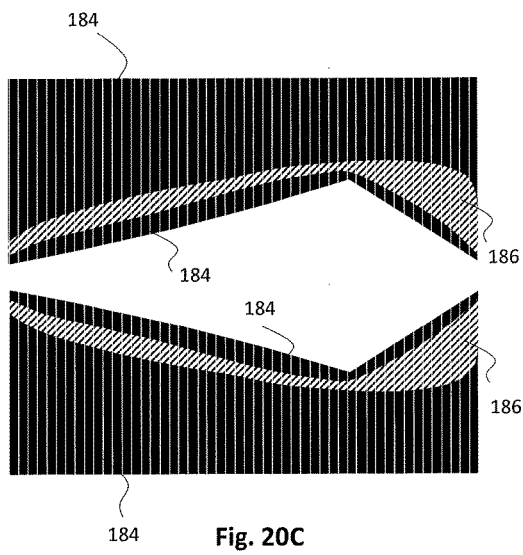

FIG. 20 shows the normalized current density ($J/J_c(B)$) in the tapes of the original, non-optimized coils (FIG. 20A) and the optimized "M-shaped" coils (FIGS. 20B and 20C) at peak value. The coil arrays shown in FIGS. 20A and 20B have a transport current of 71 A at 50 Hz. FIG. 20C shows the normalized current density ($J/J_c(B)$) for the "M-shaped" coil with a transport current of 85 A at 50 Hz. The axis of the coil (not shown) is at the left of each the image. The solid black domains represent regions 184 of the turns in the coil where the current density has reached its critical value. The dashed domains represent regions 186 of the turns in the coil where the current density has not reached its critical value.

By optimizing the spatial distribution of the amount of superconducting material, as in the above example, it is possible to achieve about 20% increase of coil's critical current $I_c$ for both DC and AC using the same amount of superconducting tape. Further, it is possible to achieve about 19% increase in the magnetic field in the coil's center using the same amount of superconducting tape, about 28% reduction of AC losses at the current transport of 71 A using the same amount of HTS tape and about 7-8% increase of current and field at matched AC losses using the same amount of HTS tape. Thus, AC losses, critical current and central magnetic field could also be matched using less superconducting tape.

EXAMPLE 2

In a second example, a striated tape having 10 filaments was optimized. FIG. 21 shows simulation results for a non-optimized 4 mm wide tape having 10 filaments of equal width (FIGS. 21A and 21C) and for an optimized 4 mm wide tape having 10 filaments with a wider outer filament (FIGS. 21B and 21D).

Figure 21A:
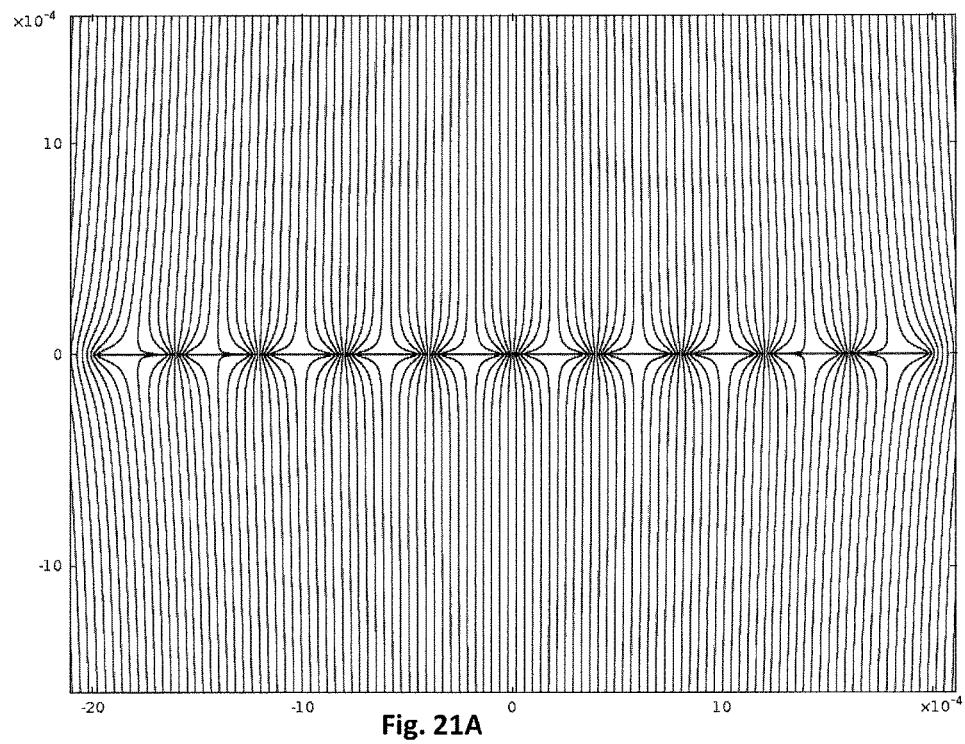
FIG. 21 shows simulation results for a non-optimized striated tape in FIG. 21A and FIG. 21C and for an optimized striated tape FIG. 21B and FIG. 21D.
Figure 21B:
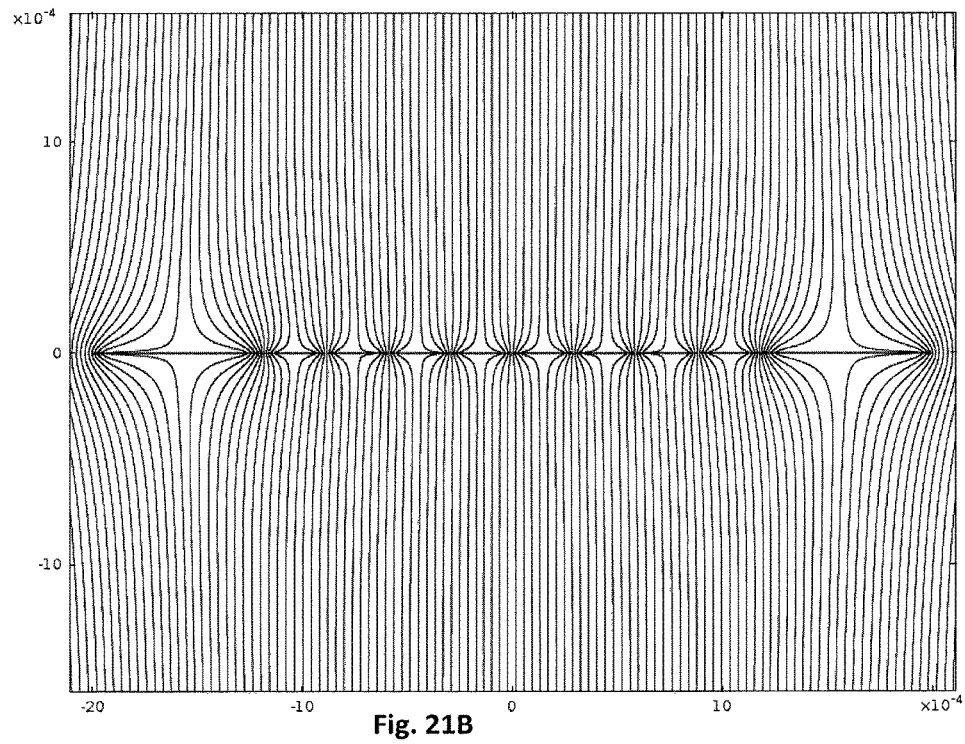

FIG. 21A to 21B [[a-b]] show the magnetic flux lines at peak value across the tape. A perpendicular magnetic flux density of 10 mT at 50 Hz is applied to both tapes. It is easy to note that in the optimized tape (FIG. 21B), the magnetic flux density in the gaps is lower than in the non-optimized tape (FIG. 21A). As discussed in detail above, this effect allows for reduced AC losses in the overall tape. Thus in the non-optimized tape the AC losses at 10 mT and 50 Hz are about 106.5 µJ/cycle, whereas in the case of optimized tape the AC losses at 10 mT and 50 Hz are about 97.6 µJ/cycle. Accordingly, in the optimized tape shown in FIG. 21B, it is possible to achieve about 8% reduction of AC losses for an applied magnetic flux density of 10 mT at 50 Hz using the same amount of HTS tape (4 mm wide) and same number of filaments (10).

Figure 21C:
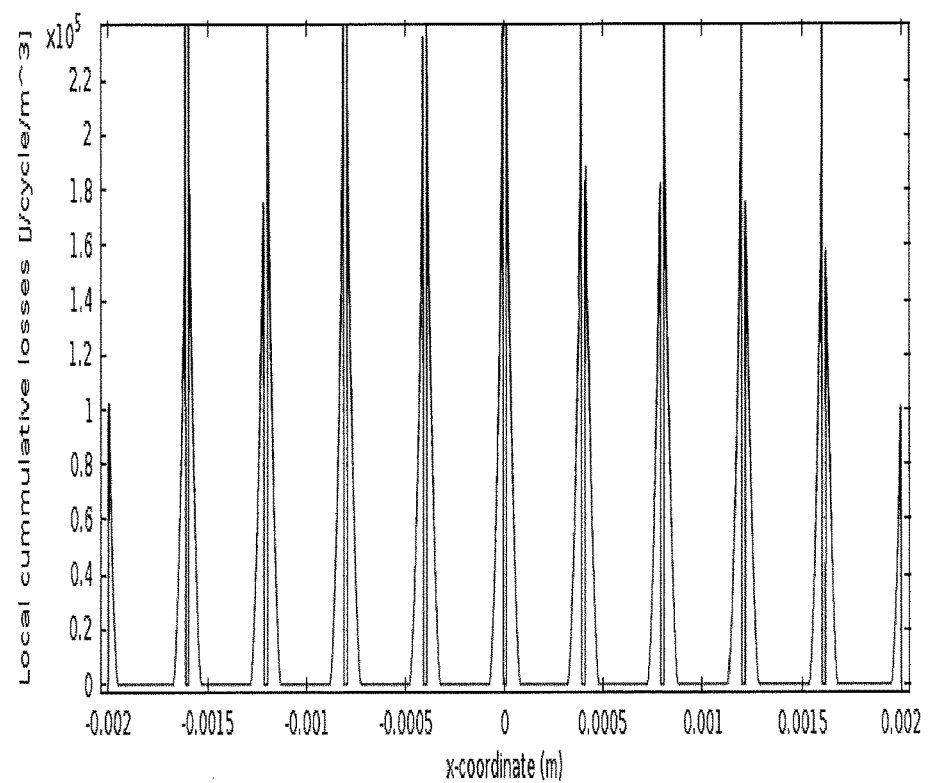
Figure 21D:
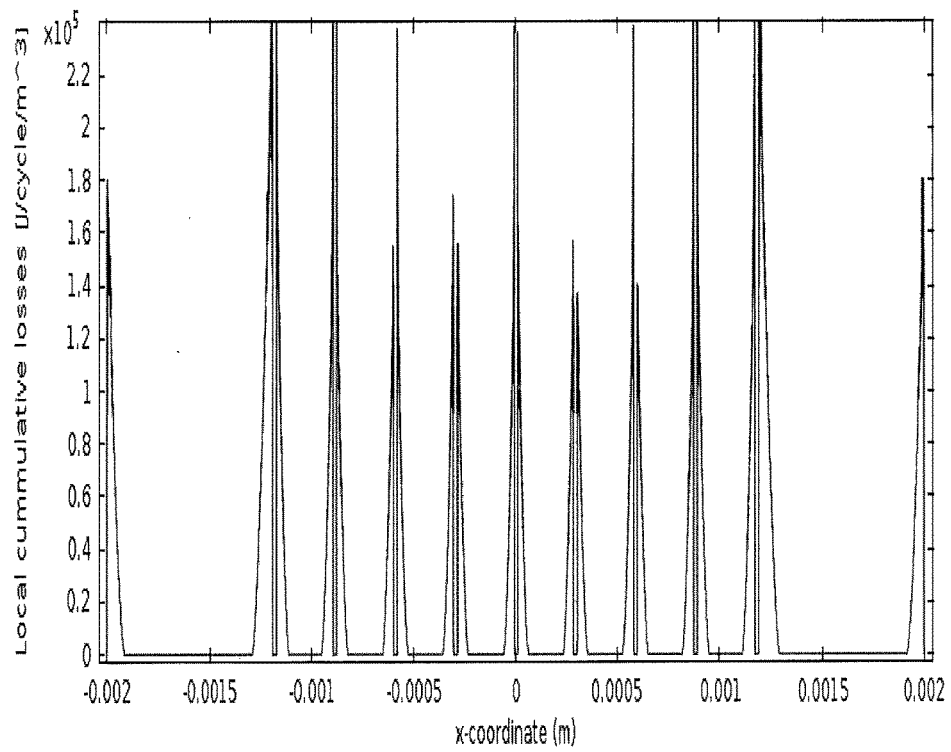

FIG. 21C to 21D [[c-d]] show the local cumulative AC losses over one cycle (perpendicularly applied field with amplitude of 10 mT at 50 Hz) for both a tape with filaments of uniform width (FIG. 21C) and for a tape with a wider outer filament (FIG. 21D). In both cases, the regions with the highest losses are the edges of the filaments. However, it is easy to note that the lossy region in the vicinity of the gaps is larger for the non-optimized tape than for the optimized one.

EXAMPLE 3

As explained above, reduction of the critical current density Jc, due for example to the magnetic field, may be compensated with superconducting material or temperature optimization. In an example, a larger amount of superconducting material may be allocated in the regions where Jc is lower and this may be compensated by allowing a smaller amount of superconducting material in the region where Jc is higher. Alternatively or in addition, heat sinks may be located where Jc is lower. These techniques can also be used for round wires.

Figures 22A, 22B:
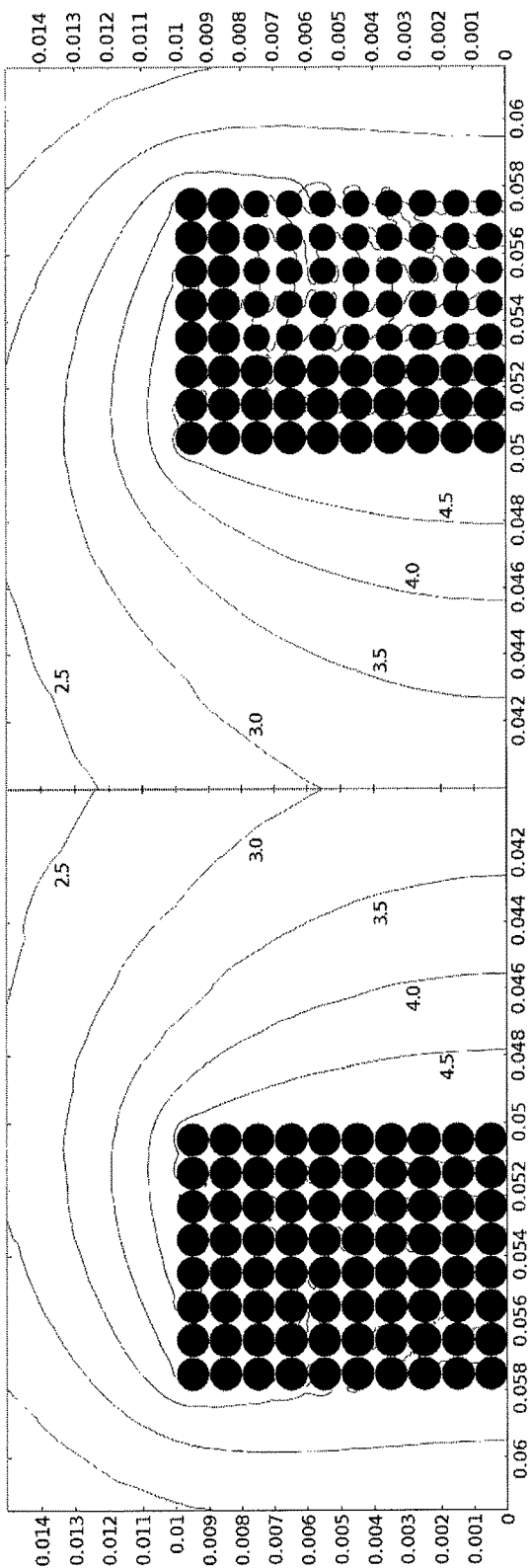
FIG. 22 shows the magnetic field in a non-optimized coil in FIG. 22A and in an optimized coil in FIG. 22B.
Figure 23:
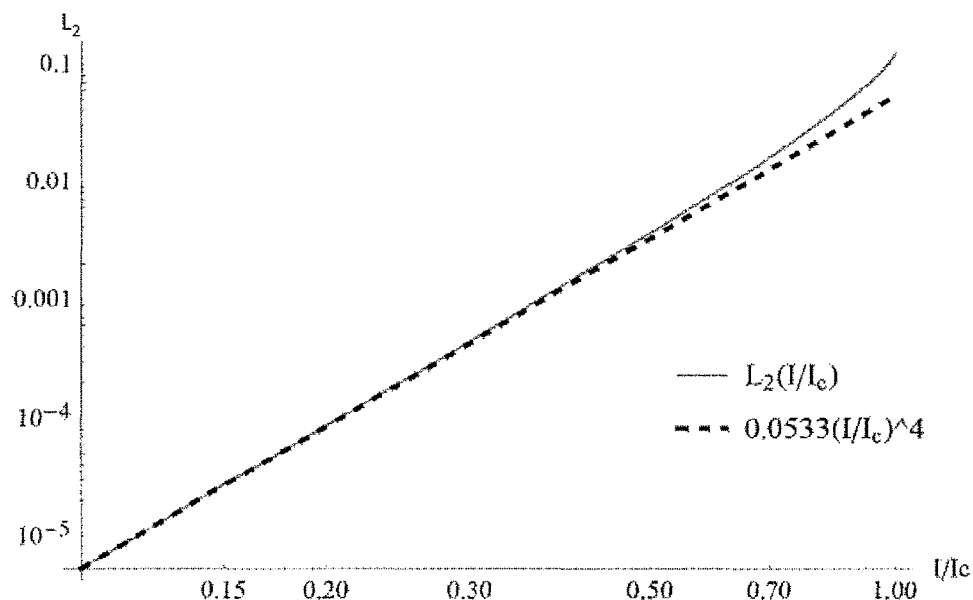
FIG. 23 shows the dependency of AC losses on $(I/I_c)$.
Figure 24:
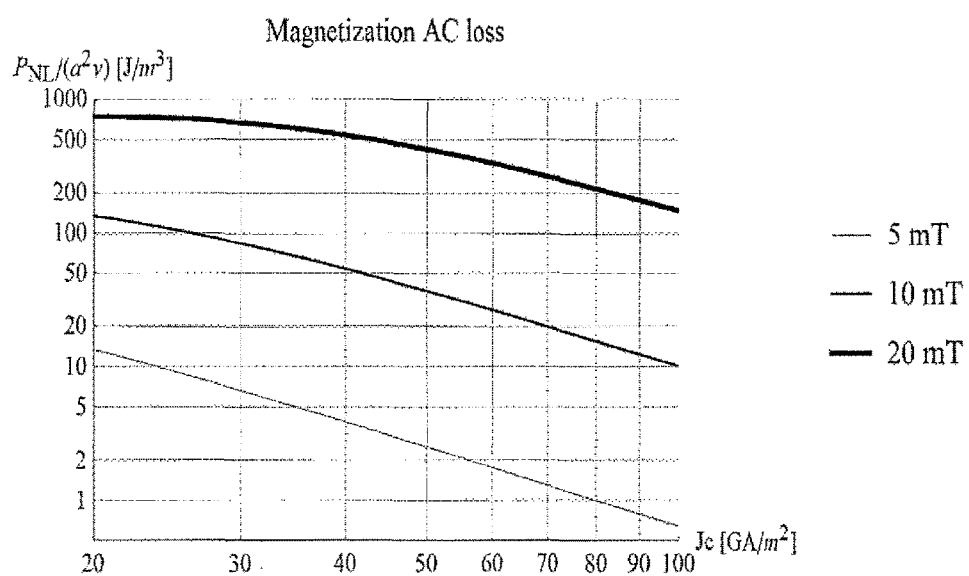
FIG. 24 shows the dependency of the magnetization AC loss on the critical current density.

In a third example, a coil is mass-optimized by using round wires having two different calibers. FIG. 22 shows simulation results of the magnetic field (in Tesla) of an original coil (FIG. 22A) and optimized coil (FIG. 22B) at their respective critical currents $I_c(DC)$. In both cases the coil is made of NbTi and has a 5 cm inner radius and 160 turns.

The original coil is formed by a wire having constant diameter of 0.99 mm having cross-sectional area of 123.14 mm$^2$. In this case, the critical current $I_c(DC)$ is 1016.4 A. The optimized coil is made of wires having two different wire diameters: a first wire diameter of 0.99 mm (80 turns) and a second wire diameter of 0.808 mm (80 turns). The conductors' cross-sectional area is 102.62 mm$^2$. The critical current (DC) is 1012.7 A. Thus, the optimized coil uses 16.7% less material.

Thus, by using just two different wire diameters, large magnets can be optimized to reduce mass and volume.

Improvements for devices using wires of different calibers may also include:
- Increase of both coil's Ic and magnetic field using the same amount of superconducting material;
- Matched Ic and central magnetic field using less superconducting material;
- Higher magnetic fields for the same mass and volume would be provided by denser packing in the region with thinner wire.

The proposed use of superconductors for various superconducting devices (such as coils, solenoids, toroids, cables, stack-like devices, etc.) with spatially varying amount and/or composition of superconducting material and/or with spatially varying temperature allows a significant performance increase in comparison to conventional designs. There are many specific applications for the proposed design when, for example, applied to coil winding including but not limited to magnets, coils, dipoles, quadrupoles, superconducting magnetic energy storage systems, current limiters, magnetic resonance devices (NMR, MRI, EPR, EMR, ESR and ICR), racetrack coils for generators and motors, coils for transformers, saddle-shape coils for accelerators, levitation and propulsion coils for magnetic levitated vehicles, magnetic separation devices, coils for split magnets, magnet coils for magnetization of permanent magnets and superconductors, magnet coils for characterization of samples, magnet coils for plasma confinement, coils for cyclotron, coils or coils-solenoid arrays for vector magnets, coils for magneto-optical systems, magnet coils for plasma diversion as in spacecraft communication systems, coils for magnetic propulsion of satellites (control of Hall effect thrusters). Similar applications exist for solenoid, toroid magnets, cables and stack-like devices. The invention is, however, not limited to the above examples: in principle any device employing superconductors may benefit from the invention.

Above, various embodiments of the invention have been described. The invention may, however, be embodied in many different forms and should not be construed as limited to the exemplary embodiments describe above. For example, various features described in connection with different exemplary embodiments may be combined, unless otherwise indicated herein or otherwise clearly contradicted by context. Further, in the drawings, the size of individual elements and regions may be exaggerated for clarity. In addition, the number of turns, layers and/or filaments constituting the superconducting device may not correspond to the real number of turns, layers and/or filaments used.

LIST OF REFERENCE NUMERALS 10 rectangular superconducting tape
12 superconducting coil assembled from a rectangular superconducting tape
122 axis of the coil
14 M-shaped superconducting tape
14a-e areas of the M-shaped superconducting tape
16 tiling pattern
18 M-shaped superconducting coil
182 axis of the coil
184 areas of the coil where the current density has reached its critical value
186 areas of the coil where the current density is below its critical value
20 single layer superconducting solenoid
210 symmetry axis of a single layer superconducting solenoid
30 single layer superconducting toroid
302 centroid of the single layer superconducting toroid
40 multi-layer superconducting solenoid
410 symmetry axis of a multi-layer superconducting solenoid
50 multi-layer superconducting toroid
502 centroid of the multi-layer superconducting toroid
60 striated superconducting tape
602, 602a-c filament
70 superconducting tape having a superconducting layer of variable thickness along the lengthwise direction
70a part/area of the superconducting tape 70 where the superconducting layer is thin
70b part/area of the superconducting tape 70 where the superconducting layer is thick
71 superconducting layer of variable thickness along the lengthwise direction
72 area having doping optimized for a parallel magnetic field
74 area having doping optimized for a perpendicular magnetic field
80 stack of superconducting tapes
802 filaments
810-830 striated tapes
90 superconducting coil assembled from round superconductors
910 round superconductor wire
910a,b round superconducting wires having different calibers

What is claimed is:
1. A superconducting device including:
a superconducting material having one or more local regions, in which a different amount of the superconducting material is used in the one or more local regions as compared to the other regions of the superconducting device; and
at least one superconducting cable, layer, or filament having a distribution of the superconducting material that varies along a length of the superconducting cable, layer or filament, wherein the superconducting cable, layer or filament has:
at least one region of decreasing width and/or thickness in which the width and/or thickness of the superconducting cable, layer, or filament decreases gradually; and at least one region of increasing width and/or thickness in which the width and/or thickness of the superconducting cable, layer, or filament increases gradually.

2. The superconducting device according to claim 1, wherein the superconducting device comprises a superconducting coil and the one or more local regions comprise the innermost turn or turns of the coil; or the superconducting device comprises a single layer solenoid and the one or more local regions comprise the regions located at the ends of the solenoid when viewed in the direction along the solenoid's axis; or the superconducting device comprises a single layer toroid and the one or more local regions comprise the regions located closest to the centroid of the toroid in each turn of the toroid; or the superconducting device comprises a multilayer solenoid and the one or more local regions comprise the regions located at the ends of the solenoid when viewed in a direction along the solenoid's axis and/or the turn or turns closest to the solenoid's axis; or the superconducting device comprises a multilayer toroid and the one or more local regions comprise the regions located closest to the centroid of the toroid in each turn of the toroid and/or the inner toroid layers; or the superconducting device comprises a striated superconducting tape and the one or more local regions comprise the central filament or filaments of the striated tape; or the superconducting device comprises a stacked superconducting device comprising a plurality of superconducting layers, each superconducting layer having a plurality of filaments, and the one or more local regions comprise the central filament or filaments of each superconducting layer of the stacked superconducting device.

3. The superconducting device according to claim 1, wherein said superconducting cable, layer, or filament has a variable cross-sectional area and/or a variable material composition along a lengthwise direction of the cable, layer, or filament; and/or the superconducting device comprises a plurality of individual superconducting cables, layers, or filaments, and wherein at least two superconducting cables, layers, or filaments have different cross-sectional areas and/or different material compositions.

4. The superconducting device according to claim 1, wherein the superconducting device comprises a plurality of turns of the at least one superconducting cable or layer, wherein the density of the windings of the at least one superconducting cable or layer in the one or more local regions of the superconducting device is lower than the density of the windings in the other regions of the superconducting device.

5. The superconducting device according to claim 1, wherein the superconducting cable is striated superconducting tape comprising a plurality of filaments, wherein:

the widths and/or the thicknesses and/or the material composition of at least two of the filaments are different; and/or the width and/or thickness and/or the material composition of at least one filament varies along the lengthwise direction of the tape.

6. The superconducting device according to claim 1, wherein the superconducting device comprises a plurality of superconducting layers, each layer having a plurality of filaments, wherein:

at least one layer comprises filaments having different width and/or thickness and/or chemical compositions; and/or the filaments of at least two of the layers have different widths and/or thicknesses and/or chemical compositions.

7. The superconducting device according to claim 1, wherein the superconducting device further comprises a plurality of heat sinks arranged in or in the vicinity of said one or more local regions.

* * * * *